(12) United States Patent
Kumar et al.

(10) Patent No.: US 9,947,642 B2
(45) Date of Patent: Apr. 17, 2018

(54) PACKAGE-ON-PACKAGE (POP) DEVICE COMPRISING A GAP CONTROLLER BETWEEN INTEGRATED CIRCUIT (IC) PACKAGES

(71) Applicant: QUALCOMM Incorporated, San Diego, CA (US)

(72) Inventors: Rajneesh Kumar, San Diego, CA (US); Chin-Kwan Kim, San Diego, CA (US); Brian Roggeman, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/069,525

(22) Filed: Mar. 14, 2016

(65) Prior Publication Data

US 2017/0098633 A1 Apr. 6, 2017

Related U.S. Application Data

(60) Provisional application No. 62/236,696, filed on Oct. 2, 2015.

(51) Int. Cl.
*H01L 25/10* (2006.01)
*H01L 23/31* (2006.01)
*H01L 23/538* (2006.01)

(52) U.S. Cl.
CPC ........ *H01L 25/105* (2013.01); *H01L 23/3114* (2013.01); *H01L 23/5386* (2013.01);
(Continued)

(58) Field of Classification Search
CPC .......... H01L 25/0756–25/105; H01L 23/3114; H01L 23/5386; H01L 25/043;
(Continued)

(56) References Cited

U.S. PATENT DOCUMENTS 7,116,002 B2 10/2006 Chao et al.
7,521,810 B2 4/2009 Kang et al.
(Continued)

FOREIGN PATENT DOCUMENTS

CN 104465427 A 3/2015

OTHER PUBLICATIONS

Marvell: "Marvell Avastar 88W8887 WLAN/Bluetooth/NFC/FM Receive Single-Chip SoC," Quad-Radio Connectivity Solution, 2015, 2 pages.
(Continued)

*Primary Examiner* — Cuong B Nguyen
(74) *Attorney, Agent, or Firm* — Loza & Loza, LLP/Qualcomm

(57) ABSTRACT

A package on package (PoP) device that includes a first package, a second package that is coupled to the first package, and at least one gap controller located between the first package and the second package, where the at least one gap controller is configured to provide a minimum gap between the first package and the second package. The first package includes a first electronic package component (e.g., first die). In some implementations, the at least one gap controller is coupled to the first package, but free of coupling with the second package. The at least one gap controller is located on or about a center of the first package. The at least one gap controller may be located between the first electronic package component (e.g., first die) and the second package. The package on package (PoP) device may include an encapsulation layer between the first package and the second package.

24 Claims, 17 Drawing Sheets

(52) U.S. Cl.
CPC ........... *H01L 2225/1023* (2013.01); *H01L 2225/1041* (2013.01)

(58) Field of Classification Search
CPC ......... H01L 25/117; H01L 2224/16145; H01L 2224/16221; H01L 2224/24145; H01L 2224/25174; H01L 2224/2908; H01L 2224/32221; H01L 2225/06503
See application file for complete search history.

(56) References Cited

U.S. PATENT DOCUMENTS

| | | |
|---|---|---|
| 8,503,186 B2 | 8/2013 | Lin et al. |
| 8,633,591 B2 | 1/2014 | Kurita et al. |
| 2003/0038355 A1 | 2/2003 | Derderian |
| 2003/0160312 A1 | 8/2003 | Lo et al. |
| 2004/0222509 A1* | 11/2004 | Ogata ............... H01L 24/29 257/686 |
| 2005/0224959 A1 | 10/2005 | Kwon et al. |
| 2005/0258527 A1 | 11/2005 | Lee et al. |
| 2007/0013060 A1* | 1/2007 | Kwon ............... H01L 24/29 257/725 |
| 2007/0278657 A1 | 12/2007 | Lee |
| 2008/0116556 A1 | 5/2008 | Chou et al. |
| 2014/0367854 A1 | 12/2014 | Zhao et al. |
| 2015/0001689 A1 | 1/2015 | Goetz et al. |

OTHER PUBLICATIONS

International Search Report and Written Opinion—PCT/US2016/054552—ISA/EPO—Nov. 23, 2016.

\* cited by examiner

PACKAGE-ON-PACKAGE (POP) DEVICE COMPRISING A GAP CONTROLLER BETWEEN INTEGRATED CIRCUIT (IC) PACKAGES

CLAIM OF PRIORITY/CLAIM OF BENEFIT

The present application claims priority to U.S. Provisional Application No. 62/236,696 titled "Package-on-Package (PoP) Device Comprising a Gap Controller Between Integrated Circuit (IC) Packages", filed Oct. 2, 2015, which is hereby expressly incorporated by reference herein.

BACKGROUND

Field of the Disclosure

Various features relate generally to a package on package (PoP) device, and more specifically to a package-on-package (PoP) device that includes a gap controller between integrated circuit (IC) packages.

Background

FIG. 1 illustrates a package on package (PoP) device 100 that includes a first package 102 and a second package 104. The first package 102 includes a first die 120, a first package substrate 122, and a first encapsulation layer 150. The first package substrate 122 includes a first plurality of pads 124 and a first pad 126. The first die 120 is coupled to the first package substrate 122 through a first plurality of solder balls 128. Specifically, the first die 120 is coupled to the first plurality of pads 124 through the first plurality of solder balls 128. A second plurality of solder balls 136 is coupled to the first package substrate 122.

The second package 104 includes a second die 140, a second package substrate 142, a second pad 146, a third plurality of solder balls 156, and a second encapsulation layer 160. The second die 140 is coupled to the second package substrate 142. The second package 104 is coupled to the first package 102 through the third plurality of solder balls 156. For example, the third plurality solder balls 156 is coupled to the first pad 126 of the first package substrate 122, and the second pad 146 of the second package 104.

FIG. 1 illustrates that there is a void 190 between the first die 120 and the second package substrate 142 of the second package 104. The void 190 is a space that is not occupied by the first encapsulation layer 150. The void 190 occurs when the gap or space between the first die 120 and the second package substrate 142 is not sufficiently large or wide enough for the first encapsulation layer 150 to completely flow in between the first die 120 and the second package substrate 142.

The presence of the void 190 can cause warpage and/or deformation (as illustrated by the arrow) in the package on package (PoP) device 100 because of the lack of structural support around that space. One undesirable side effect of the warpage and/or deformation are the weak joints and/or open joints that may occur between the third plurality of solder balls 156 and the first pad 126 and the second pad 146. As shown in FIG. 1, the warpage and/or deformation of the package on package device (PoP) 100 causes the space to increase between the first pad 126 and the second pad 146, which effectively stretches the third plurality of solder balls 156 (as illustrated by the arrow), resulting in a weaker joint and/or open joint in the package on package (PoP) device 100. A weak joint and/or an open joint can prevent signals from properly traversing through a package on package (PoP) device, resulting in a defective package on package (PoP) device.

There is an ongoing industry trend to reduce the size, height and/or spaces of packages, as these packages are placed in smaller and smaller devices. Ideally, such a package will have a better form factor, be cheaper to fabricate, while at the same time meeting the needs and/or requirements of mobile and/or wearable devices.

SUMMARY

Various features relate generally to a package on package (PoP) device, and more specifically to a package-on-package (PoP) device that includes a gap controller between integrated circuit (IC) packages.

One example provides a package on package (PoP) device that includes a first package, a second package that is coupled to the first package, and at least one gap controller located between the first package and the second package, where the at least one gap controller is configured to provide a minimum gap between the first package and the second package. The first package includes a first electronic package component.

Another example provides an apparatus that includes a first package, a second package coupled to the first package, and means for gap control configured to provide a minimum gap between the first package and the second package, where the means for gap control is located between the first package and the second package. The first package includes a first electronic package component.

Another example provides a method for fabricating a package on package (PoP) device. The method provides a first package, where providing the first package includes providing a first electronic package component. The method couples a second package to the first package. The method provides at least one gap controller between the first package and the second package. The at least one gap controller is configured to provide a minimum gap between the first package and the second package.

DRAWINGS

Various features, nature and advantages may become apparent from the detailed description set forth below when taken in conjunction with the drawings in which like reference characters identify correspondingly throughout.

DETAILED DESCRIPTION

Figure 1:
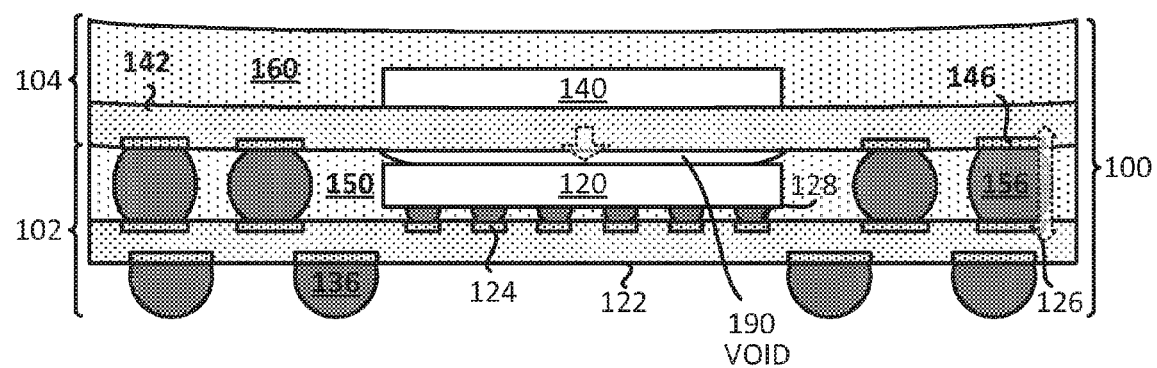
FIG. 1 illustrates a cross-sectional view of a package on package (PoP) device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a package on package (PoP) device that includes a first package, a second package that is coupled to the first package, and at least one gap controller located between the first package and the second package, where the at least one gap controller is configured to provide a minimum gap between the first package and the second package. The first package includes a first electronic package component (e.g., first die). In some implementations, the at least one gap controller is coupled to the first package, but free of coupling with the second package. In some implementations, the at least one gap controller is located on or about a center of the first package. In some implementations, the at least one gap controller is located between the first electronic package component (e.g., first die) and the second package. In some implementations, the package on package (PoP) device includes an encapsulation layer between the first package and the second package.

In some implementations, the height of the package may be defined along the Z-direction of the package, which is shown in the figures of the present disclosure. In some implementations, the Z-direction of the package may be defined along an axis between a top portion and a bottom portion of the package. The terms top and bottom may be arbitrarily assigned, however as an example, the top portion of the package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion. Further examples of top portions and bottom portions will be further described below. The X-Y directions of the package may refer to the lateral direction and/or footprint of the package. Examples of X-Y directions are shown in the figures of the present disclosure and/or further described below. In many of the figures of the present disclosure, the packages and their respective components are shown across a X-Z cross-section or X-Z plane. However, in some implementations, the packages and their representative components may be represented across a Y-Z cross-section or Y-Z plane.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Package on Package (PoP) Device Comprising a Gap Controller

Figure 2:
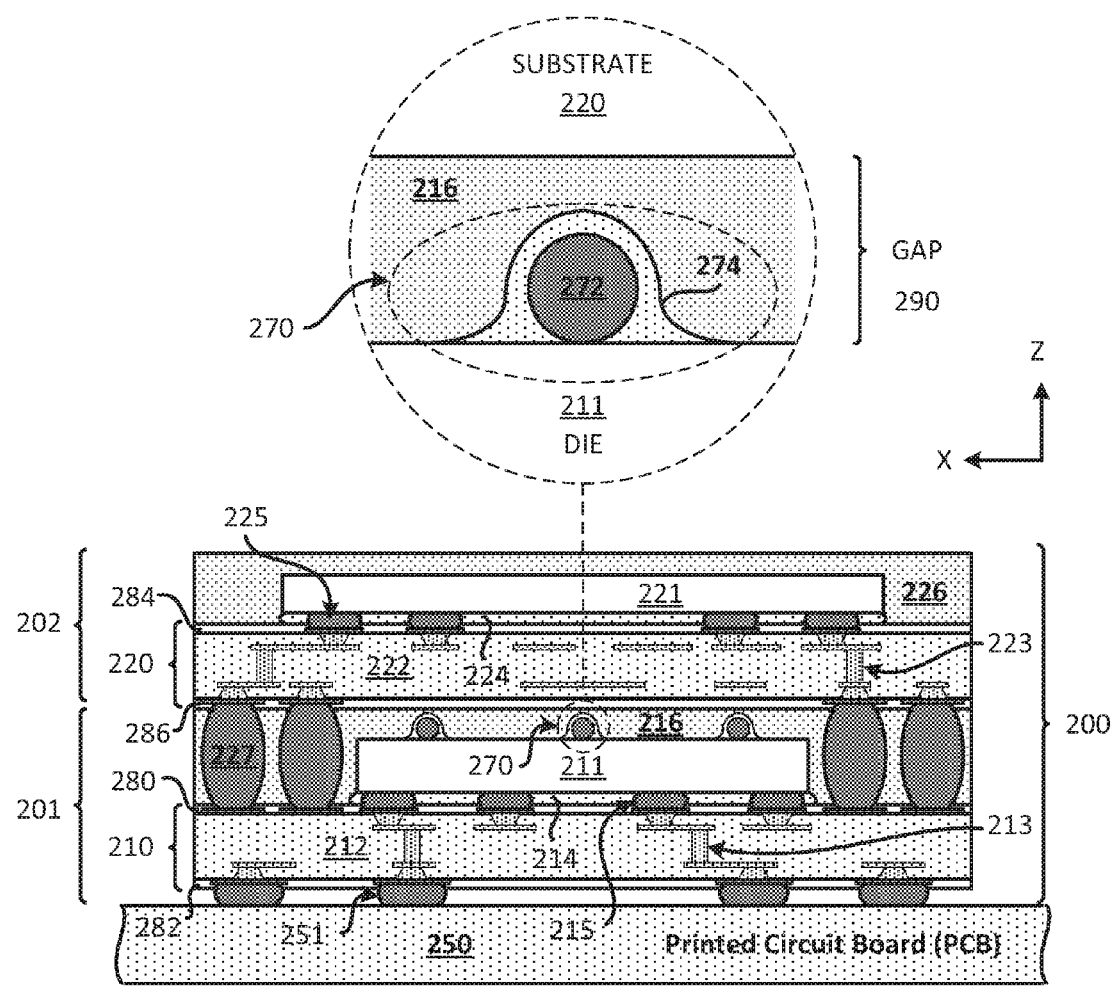
FIG. 2 illustrates a cross-sectional view of a package on package (PoP) device that includes a gap controller.

FIG. 2 illustrates a package on package (PoP) device 200 that includes a first package 201, a second package 202, and a gap controller 270. The second package 202 is coupled to the first package 201. The first package 201 may be a first integrated circuit (IC) package, and the second package 202 may be a second integrated circuit (IC) package. The package on package (PoP) device 200 is coupled to a printed circuit board (PCB) 250 through a plurality of solder balls 251.

In some implementations, the gap controller 270 is located between the first package 201 and the second package 202. In some implementations, the gap controller 270 is located between an electronic package component (e.g., first die 211) of the first package 201 and the second package 202.

As will be further described below, in some implementations, the gap controller 270 is configured to provide mechanical support for the second package 202 (e.g., second package substrate 220 of the second package 202). Thus, in some implementations, the gap controller 270 may be configured to operate as a back stop for any warpage, deformation and/or deflection in the second package 202.

In some implementations, the gap controller 270 is configured to ensure that there is enough distance, space or gap between a die of the first package 201, and a package substrate of the second package 202, so that an encapsulation layer can be provided (e.g., formed) in the space or the gap between the die of the first package 201, and the package substrate of the second package 202. In some implementations, the gap controller 270 may include one or more material that is electrically conductive. However, the gap controller 270 is configured to not provide an electrical path for an electrical signal.

The first package 201 includes a first package substrate 210, a first die 211, a first underfill 214, a plurality of first solder balls 215, a first encapsulation layer 216, and the gap controller 270. In some implementations, the first package 201 may also include a plurality of package interconnects 227. The first die 211 is an example of an electronic package component.

The first package substrate 210 includes at least one dielectric layer 212, a plurality of first interconnects 213 (e.g., plurality of first substrate interconnects), a first solder resist layer 280 and a second solder resist layer 282. The plurality of first interconnects 213 may include traces, vias and/or pads. The first package substrate 210 is coupled to the printed circuit board (PCB) 250 through the plurality of solder balls 251. More specifically, the plurality of first interconnects 213 is coupled to the plurality of solder balls 251.

The first die 211 may be an integrated circuit (IC) that includes a plurality of transistors and/or other electronic components. The first die 211 may be a logic die and/or a memory die. The first die 211 may be a bare die. The first die 211 is coupled to the first package substrate 210 through the plurality of first solder balls 215. The first underfill 214 is located between the first die 211 and the first package substrate 210. The first underfill 214 may at least partially surround at least some of the plurality of first solder balls 215.

The first encapsulation layer 216 is optional. The first encapsulation layer 216 at least partially encapsulates the first die 211, the gap controller 270, and the plurality of package interconnects 227. Different implementations may use different materials for the first encapsulation layer 216. For example, the first encapsulation layer 216 may include a mold and/or an epoxy fill.

The second package 202 includes a second package substrate 220, a second die 221, a second underfill 224, a plurality of second solder balls 225, and a second encapsulation layer 226. In some implementations, the second package 202 may also include the plurality of package interconnects 227.

The second package substrate 220 includes at least one dielectric layer 222, a plurality of second interconnects 223 (e.g., plurality of second substrate interconnects), a first solder resist layer 284 and a second solder resist layer 286. The plurality of second interconnects 223 may include traces, vias and/or pads.

The second die 221 may be an integrated circuit (IC) that includes a plurality of transistors and/or other electronic components. The second die 221 may be a logic die and/or a memory die. The second die 221 may be a bare die. The second die 221 is coupled to the second package substrate 220 through the plurality of second solder balls 225. The second underfill 224 is located between the second die 221 and the second package substrate 220. The second underfill 224 may at least partially surround at least some of the plurality of second solder balls 225.

The second encapsulation layer 226 at least partially encapsulates the second die 221. Different implementations may use different materials for the second encapsulation layer 226. For example, the second encapsulation layer 226 may include a mold and/or an epoxy fill.

The second package 202 is coupled to the first package 201 through the plurality of package interconnects 227. The plurality of package interconnects 227 may include a solder interconnect (e.g., solder ball). The plurality of package interconnects 227 is coupled to the first package substrate 210 and the second package substrate 220. More specifically, the plurality of package interconnects 227 is coupled to the plurality of the first interconnects 213 (of the first package substrate 210) and the plurality of second interconnects 223 (of the second package substrate 220).

The gap controller 270 may be a means for gap control configured to provide a minimum gap between a first die (e.g., first die 211) and a second package (e.g., the second package 202). The gap controller 270 is located over the first die 211 (e.g., over a back side surface of the first die 211). In particular, the gap controller 270 is located between the first die 211 and the second package substrate 220 of the second package 202. In some implementations, the gap controller 270 is configured to provide a minimum distance, a minimum space, and/or a minimum gap between the first die 211 of the first package 201, and the second package substrate 220 of the second package 202. In some implementations, the minimum distance, the minimum space, the minimum gap ensures that there is enough room for the first encapsulation layer 216 to flow (e.g., during a fabrication process) between the first die 211 of the first package 201, and the second package substrate 220 of the second package 202, even when there is warpage, deformation, and/or deflection of the second package substrate 220. Thus, in some implementations, at least one gap controller 270 that is located over the first die 211 (e.g., over a back side surface of the first die 211) ensures that a sufficient amount of the first encapsulation layer 216 is formed between the first die 211 and the second package substrate 220 (of the second package 202).

In some implementations, one or more of the gap controller 270, individually or collectively, may occupy less than substantially all of a space between a first die (e.g., first die 211) and a second package (e.g., second package 202). In some implementations, one or more of the gap controller 270, individually or collectively, is coupled to less than substantially all of a back side surface of a first die (e.g., first die 211). In some implementations, one or more of the gap controller 270, individually or collectively, is coupled to less than a majority of a back side surface of a first die (e.g., first die 211).

The distance, space or gap between the first die 211 (e.g., top surface of the first die 211) and the second package 202 (e.g., bottom surface of the second package substrate 220) may vary with different implementations. In some implementations, the gap 290 may be about 15 microns (μm) or more. In some implementations, the gap controller 270 has a height and/or thickness of about 15-100 microns (μm) or less.

In some implementations, the gap controller 270 ensures that the minimum gap (e.g., gap 290) between the first die 211 (e.g., back side surface of the first die 211) and the second package 202 (e.g., bottom surface of the second package substrate 220) is about 15 microns (μm) or greater.

In some implementations, the gap controller 270 eliminates, reduces and/or minimizes a void between the first die 211 and the second package substrate 220, thereby providing a more robust and reliable package on package (PoP) device 200. Thus, the gap controller 270 is configured to allow the first encapsulation layer 216 to fill the space (e.g., to at least fill a majority or a substantial part of the space) between the first die 211 and the second package substrate 220. Moreover, the gap controller 270 is configured to not substantially impede the flow of the first encapsulation layer 216 (e.g., during a fabrication process), when the first encapsulation layer 216 is formed. An example of how the first encapsulation layer 216 is formed is further described below in FIG. 12. Thus, the use of one or more of the gap controller 270 provides an effective and counter intuitive approach to ensure that the first encapsulation layer 216 can flow between the first die 211 and the second package substrate 220, during a fabrication process of the package on package (PoP) device 200.

Different implementations may position the gap controller 270 over different portions of the first die 211. In some implementations, the greatest amount of warpage, deformation, and/or deflection of the second package substrate 220 may occur in a space above a center of the first die 211, a center of the first package 201 and/or a center of the second package 202. In some implementations, the gap controller 270 may be positioned on or about (e.g., near) a center of the first die 211, to ensure that there is support in a portion of the second package substrate 220 that may potentially have the greatest amount of warpage, deformation and/or deflection.

FIG. 2 illustrates that the gap controller 270 includes a spacer 272 and an adhesive layer 274. The adhesive layer 274 at least partially surrounds the spacer 272. Different implementations may use different materials for the spacer 272 and the adhesive layer 274. In some implementations, the spacer 272 may be a metal ball (e.g., copper ball). The adhesive layer 274 may be used to couple the spacer 272 to the first die 211. In some implementations, the adhesive layer 274 may be configured to prevent the gap controller 270 from substantially moving when the first encapsulation layer 216 is formed between the first die 211 and the second package 202.

The spacer 272 may include a solid spacer that includes a ceramic, a metal, and/or a polymer (e.g., copper, a polymer core ball and/or polymer post). The adhesive layer 274 may include an underfill and/or a high viscosity corner fill material (e.g., Cookson HEL-30, Namics G8345D) and RTV silicon (e.g., ASE 600). The adhesive layer 274 may include a sintering paste (e.g., Ormet 406, CS650).

As shown in FIG. 2, the first encapsulation layer 216 at least partially surrounds the adhesive layer 274 and/or the spacer 272. FIG. 2 also illustrates that the gap controller 270 is in direct physical contact with the first die 211, but not in direct physical contact with the second package 202 (e.g., second package substrate 220 of the second package 202). In some implementations, the gap controller 270 may be in direct physical contact with both the first die 211 and the second package 202 (e.g., second package substrate 220 of the second package 202). In some implementations, the gap controller 270 may be in direct physical contact with the second package 202 (e.g., second package substrate 220 of the second package 202), but not in direct contact with the first die 211.

The present disclosure illustrates and describes solder balls (e.g., 215, 225) being used to couple the dies (e.g., 211, 221) to the package substrates (e.g., 210, 220). However, in some implementations, other interconnects may be used to couple the dies to the package substrates. For examples, some implementations may use wire bonding and pillars (e.g., copper pillars) to couple dies to the package substrate.

As mentioned above, different implementations may use different configurations of the gap controller 270. For example, different implementations may use different numbers of the gap controller 270. Moreover, the gap controller 270 may be located differently over the first die 211 (e.g., on or about the center of the first die 211). In some implementations, the gap controller 270 may include different structures and/or materials.

Figure 3:
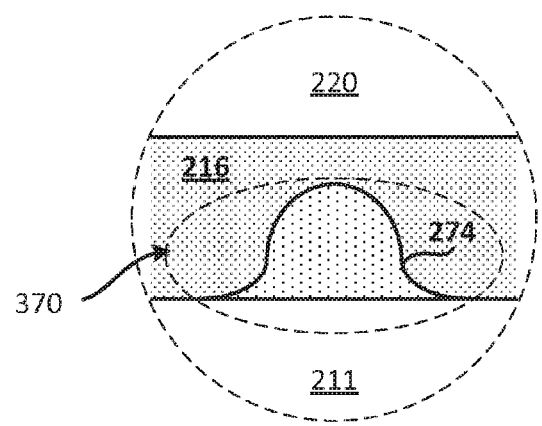
FIG. 3 illustrates an example of a gap controller.

FIG. 3 illustrates a gap controller 370 that includes the adhesive layer 274. The adhesive layer 274 is formed over the first die 211, and is at least partially surrounded by the first encapsulation layer 216.

Figure 4:
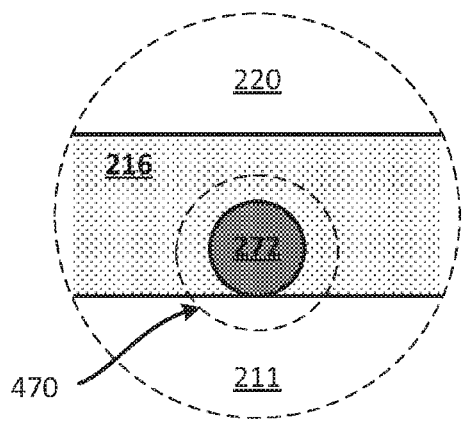
FIG. 4 illustrates another example of a gap controller.

FIG. 4 illustrates a gap controller 470 that includes the spacer 272. The spacer 272 is formed over the first die 211, and is at least partially surrounded by the first encapsulation layer 216.

Figure 5:
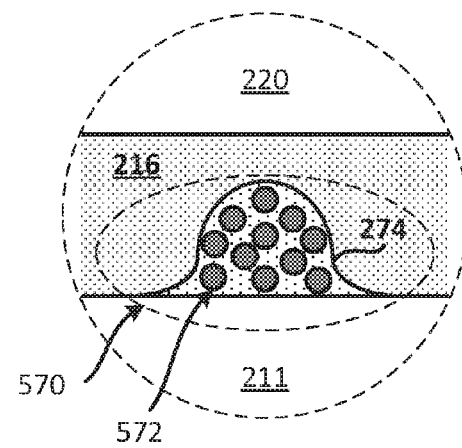
FIG. 5 illustrates another example of a gap controller.

FIG. 5 illustrates a gap controller 570 that includes a plurality of spacers 572 and the adhesive layer 274. The plurality of spacers 572 are at least partially surrounded by the adhesive layer 274. The plurality of spacers 572 and adhesive layer 274 are formed over the first die 211, and are at least partially surrounded by the first encapsulation layer 216.

As shown in the present disclosure, the gap controllers (e.g., 270, 370, 470, 570) are coupled to a first package (e.g., first package 201), but free from coupling to a second package (e.g., second package 202). In some implementations, the gap controllers (e.g., 270, 370, 470, 570) may physically touch a second package, but are not permanently coupled to a second package. For example, the gap controllers that are bonded to the first package but not bonded to (e.g., free from bonding with) the second package may move with the first package, but the gap controllers may freely move relative to the second package.

The gap controllers 370, 470 and/or 570 may be means for gap control for providing a minimum gap between a first die (e.g., first die 211) and a second package (e.g., the second package 202). In some implementations, one or more of the gap controllers 370, 470, 570 may occupy less than substantially all of a space between a first die (e.g., first die 211) and a second package (e.g., second package 202). In some implementations, one or more of the gap controllers 370, 470, and/or 570, individually or collectively, is coupled to less than substantially all of a back side surface of a first die (e.g., first die 211). In some implementations, one or more of the gap controllers 370, 470, and/or 570, individually or collectively, is coupled to less than a majority of a back side surface of a first die (e.g., first die 211).

The dimensions as described for the gap controller 270 may be applicable to the dimensions for the gap controllers 370, 470, and/or 570. Moreover, the gap controllers 370, 470, and/or 570 may be implemented in any of the package on package (PoP) devices described in the present disclosure. Different implementations may include different configurations and/or combinations of the package on package (PoP) devices that includes a gap controller. Below are further examples of different package on package (PoP) devices that include a gap controller.

Exemplary Package on Package (PoP) Device Comprising a Gap Controller

Figure 6:
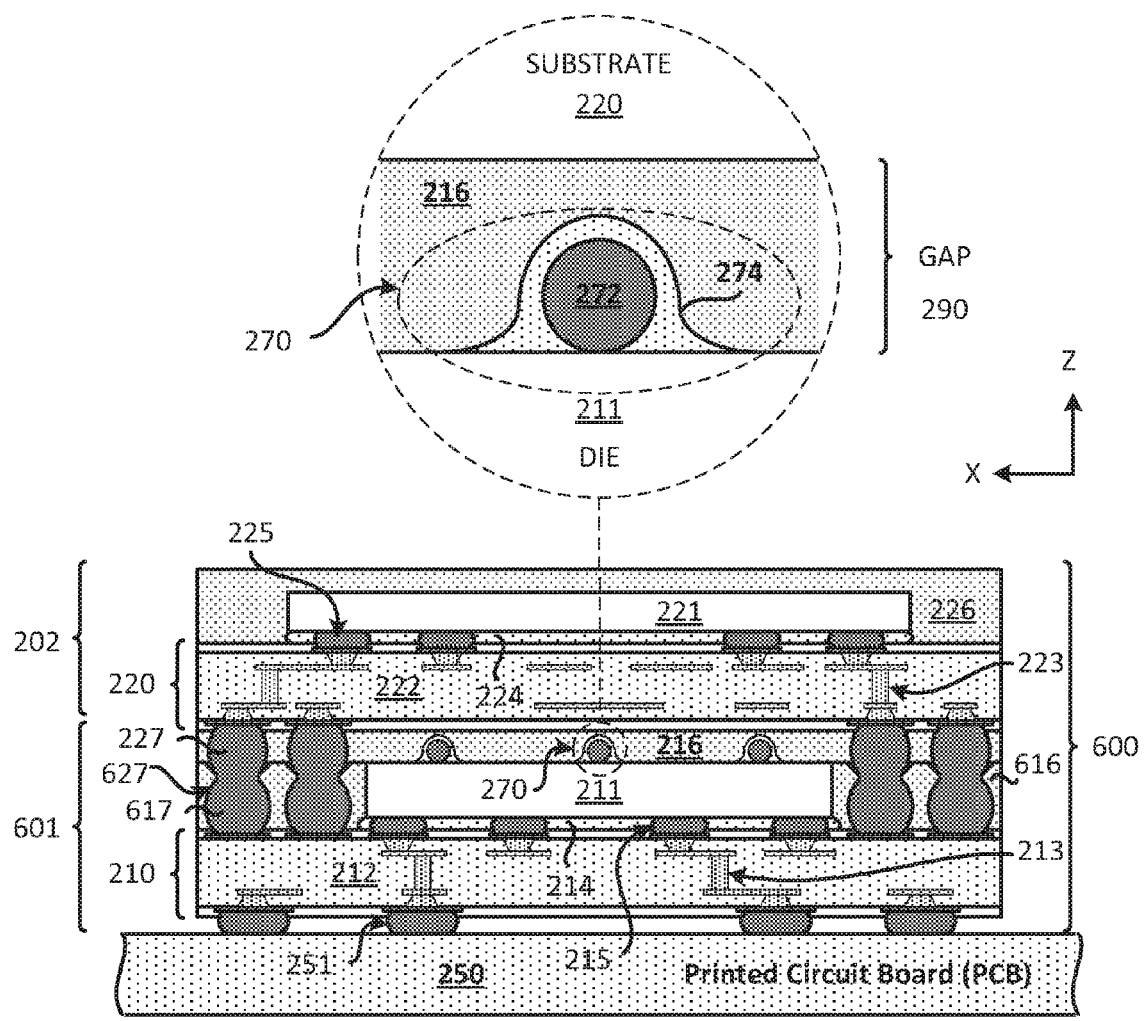
FIG. 6 illustrates a cross-sectional view of another package on package (PoP) device that includes a gap controller.

FIG. 6 illustrates another package on package (PoP) device 600 that includes a first package 601, the second package 202, and the gap controller 270. The second package 202 is coupled to the first package 601. The first package 601 may be a first integrated circuit (IC) package. The package on package (PoP) device 600 is coupled to a printed circuit board (PCB) 250 through the plurality of solder balls 251. The package on package (PoP) device 600 is similar to the package on package (PoP) device 200, except that the first package 601 has a different configuration.

In some implementations, the gap controller 270 is located between the first package 601 and the second package 202. In some implementations, the gap controller 270 is located between an electronic package component (e.g., first die 211) of the first package 601 and the second package 202.

As described above and further described below, in some implementations, the gap controller 270 is configured to provide mechanical support for the second package 202 (e.g., second package substrate 220 of the second package 202). Thus, in some implementations, the gap controller 270 may be configured to operate as a back stop for any warpage, deformation and/or deflection in the second package 202.

In some implementations, the gap controller 270 is configured to ensure that there is enough distance, space or gap between a die of the first package 601, and a package substrate of the second package 202, so that an encapsulation layer can be provided (e.g., formed) in the space or the gap between the die of the first package 601, and the package substrate of the second package 202.

The first package 601 includes the first package substrate 210, the first die 211, the first underfill 214, the plurality of first solder balls 215, the first encapsulation layer 216, the gap controller 270, and an encapsulation layer 616. Thus, the first package 601 includes two encapsulation layers (e.g., 216, 616). In some implementations, the first package 601 may also include a plurality of package interconnects 627. The plurality of package interconnects 627 may include a plurality of package interconnects 617 and the plurality of package interconnects 227.

The encapsulation layer 616 at least partially encapsulates the first die 211 and the plurality of package interconnects 627. For example, the encapsulation layer 616 may at least partially encapsulate the first die 211 and the plurality of package interconnects 617. In some implementations, a surface of the encapsulation layer 616 may be substantially co-planar with a surface (e.g., back side surface) of the first die 211. The first encapsulation layer 216 is formed over the first die 211 and the encapsulation layer 616. The encapsulation layer 616 may be the same material or a different material as the first encapsulation layer 216. The first encapsulation layer 216 at least partially encapsulates the gap controller 270 and the plurality of package interconnects 627. The first encapsulation layer 216 is optional.

The second package 202 includes the second package substrate 220, the second die 221, the second underfill 224, the plurality of second solder balls 225, and the second encapsulation layer 226. In some implementations, the second package 202 may also include the plurality of package interconnects 627, which includes the plurality of package interconnects 617 and the plurality of package interconnects 227.

The second package 202 is coupled to the first package 601 through the plurality of package interconnects 627, which includes the plurality of package interconnects 227 and the plurality of package interconnects 617. The plurality of package interconnects 627 may include a solder interconnect (e.g., solder ball). The plurality of package interconnects 627 is coupled to the first package substrate 210 and the second package substrate 220. In particular, the plurality of package interconnects 627 is coupled to the plurality of the first interconnects 213 (of the first package substrate 210) and the plurality of second interconnects 223 (of the second package substrate 220). In some implementations, the plurality of package interconnects 227 is coupled to the plurality of second interconnects 223 and the plurality of package interconnects 617. The plurality of package interconnects 617 is coupled to the plurality of first interconnects 213.

The gap controller 270 is located over the first die 211 (e.g., over a top surface of the first die 211). In particular, the gap controller 270 is located between the first die 211 of the first package 601, and the second package substrate 220 of the second package 202. In some implementations, the gap controller 270 is configured to provide a minimum distance, a minimum space, and/or a minimum gap between the first die 211 of the first package 601, and the second package substrate 220 of the second package 202. In some implementations, the minimum distance, the minimum space, the minimum gap ensures that there is enough room for the first encapsulation layer 216 to flow (e.g., during a fabrication process) between the first die 211 of the first package 601, and the second package substrate 220 of the second package 202, even when there is warpage, deformation, and/or deflection of the second package substrate 220. Thus, in some implementations, at least one gap controller 270 that is located over the first die 211 (e.g., over a top surface of the first die 211) ensures that a sufficient amount of the first encapsulation layer 216 is formed between the first die 211 and the second package substrate 220 (of the second package 202).

Exemplary Package on Package (PoP) Device Comprising a Gap Controller

Figure 7:
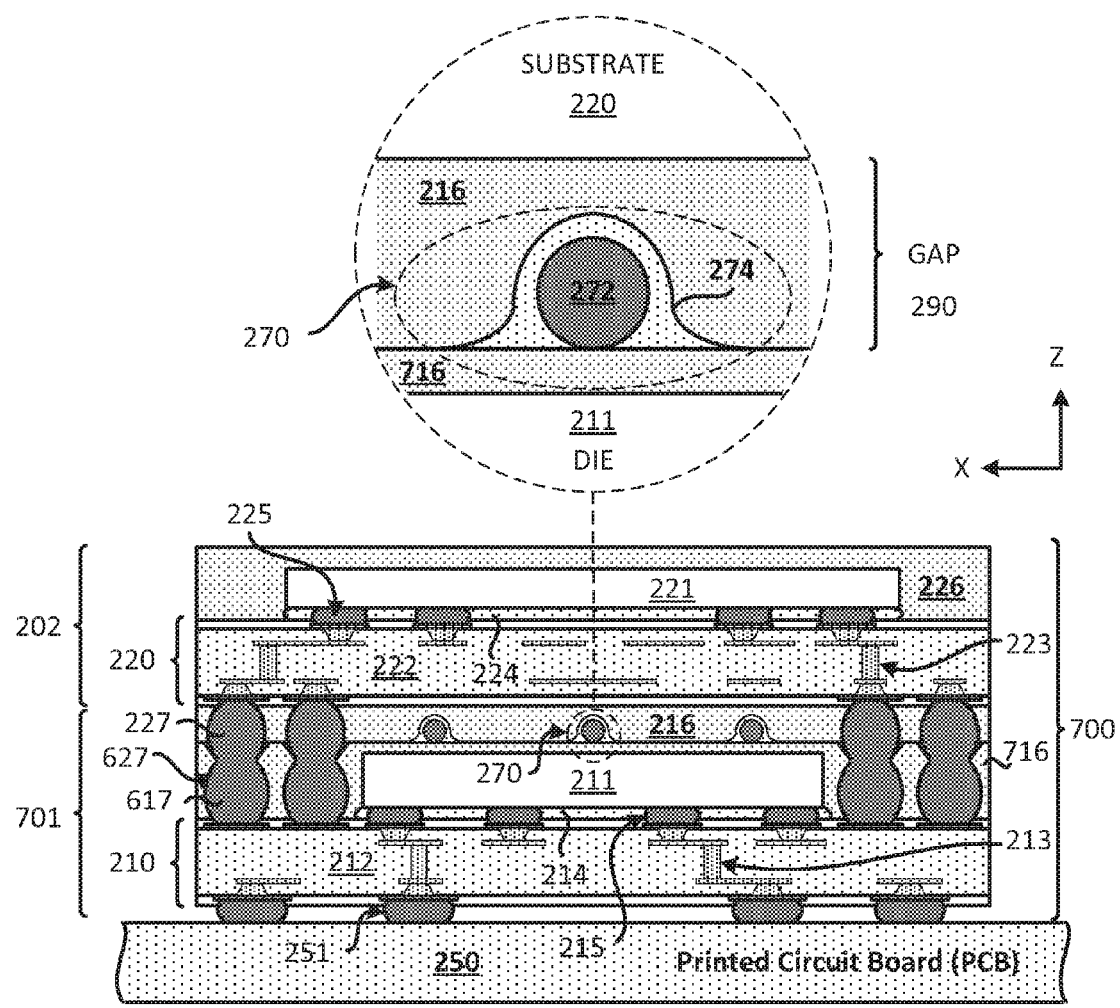
FIG. 7 illustrates a cross-sectional view of another package on package (PoP) device that includes a gap controller.

FIG. 7 illustrates another package on package (PoP) device 700 that includes a first package 701, the second package 202, and the gap controller 270. The second package 202 is coupled to the first package 701. The first package 701 may be a first integrated circuit (IC) package. The package on package (PoP) device 700 is coupled to a printed circuit board (PCB) 250 through the plurality of solder balls 251. The package on package (PoP) device 700 is similar to the package on package (PoP) device 600, except that the first package 701 has a different configuration. In particular, the first package 701 includes two encapsulation layers where one encapsulation layer is over molded over the first die 211 of the first package 701.

In some implementations, the gap controller 270 is located between the first package 701 and the second package 202. In some implementations, the gap controller 270 is located between an electronic package component (e.g., first die 211) of the first package 701 and the second package 202.

As described above and further described below, in some implementations, the gap controller 270 is configured to provide mechanical support for the second package 202 (e.g., second package substrate 220 of the second package 202). Thus, in some implementations, the gap controller 270 may be configured to operate as a back stop for any warpage, deformation and/or deflection in the second package 202.

In some implementations, the gap controller 270 is configured to ensure that there is enough distance, space or gap between a die of the first package 701, and a package substrate of the second package 202, so that an encapsulation layer can be provided (e.g., formed) in the space or the gap between the die of the first package 701, and the package substrate of the second package 202.

The first package 701 includes the first package substrate 210, the first die 211, the first underfill 214, the plurality of first solder balls 215, the first encapsulation layer 216, the gap controller 270, and an encapsulation layer 716. Thus, the first package 701 includes two encapsulation layers (e.g., 216, 716). In some implementations, the first package 701 may also include the plurality of package interconnects 627. The plurality of package interconnects 627 may include the plurality of package interconnects 617 and the plurality of package interconnects 227.

The encapsulation layer 716 at least partially encapsulates the first die 211 and the plurality of package interconnects 627. In particular, the encapsulation layer 716 is over molded over the first die 211. That is, the encapsulation layer 716 encapsulates a surface (e.g., back side surface) of the first die 211. Thus, a surface of the encapsulation layer 716 is not substantially co-planar with a surface (e.g., back side surface) of the first die 211. The first encapsulation layer 216 at least partially encapsulates the gap controller 270 and the plurality of package interconnects 627. The first encapsulation layer 216 is formed over the encapsulation layer 716. The encapsulation layer 716 may be the same material or a different material as the first encapsulation layer 216. The first encapsulation layer 216 is optional.

As shown in FIG. 7, the gap controller 270 is located over the encapsulation layer 716. In particular, the gap controller 270 is located between the first die 211 of the first package 701, and the second package substrate 220 of the second package 202. In some implementations, the gap controller 270 is configured to provide a minimum distance, a minimum space, and/or a minimum gap between the encapsulation layer 716 over the first die 211 of the first package 701, and the second package substrate 220 of the second package 202. In some implementations, the minimum distance, the minimum space, the minimum gap ensures that there is enough room for the first encapsulation layer 216 to flow (e.g., during a fabrication process) between the encapsulation layer 716 over first die 211 of the first package 701, and the second package substrate 220 of the second package 202, even when there is warpage, deformation, and/or deflection of the second package substrate 220. Thus, in some implementations, at least one gap controller 270 that is located over the encapsulation layer 716 on the first die 211 ensures that a sufficient amount of the first encapsulation layer 216 is formed between the encapsulation layer 716 over the first die 211 and the second package substrate 220 (of the second package 202).

FIG. 7 illustrates that the gap controller 270 is not in direct physical contact with the first die 211 nor the second package 202 (e.g., second package substrate 220 of the second package 202). FIG. 7 also illustrates that the gap controller 270 is configured to provide a gap 290 (e.g., minimum gap) between the encapsulation layer 716 over the first die 211, and the second package 202 (e.g., bottom surface of the second package substrate 220 of the second package 202). In some implementations, a gap between the first die 211 and the second package 202 (e.g., second package substrate 220 of the second package 202) may include the gap 290 and a thickness of the encapsulation layer 716 over the first die 211.

Exemplary Package on Package (PoP) Device Comprising a Gap Controller

Figure 8:
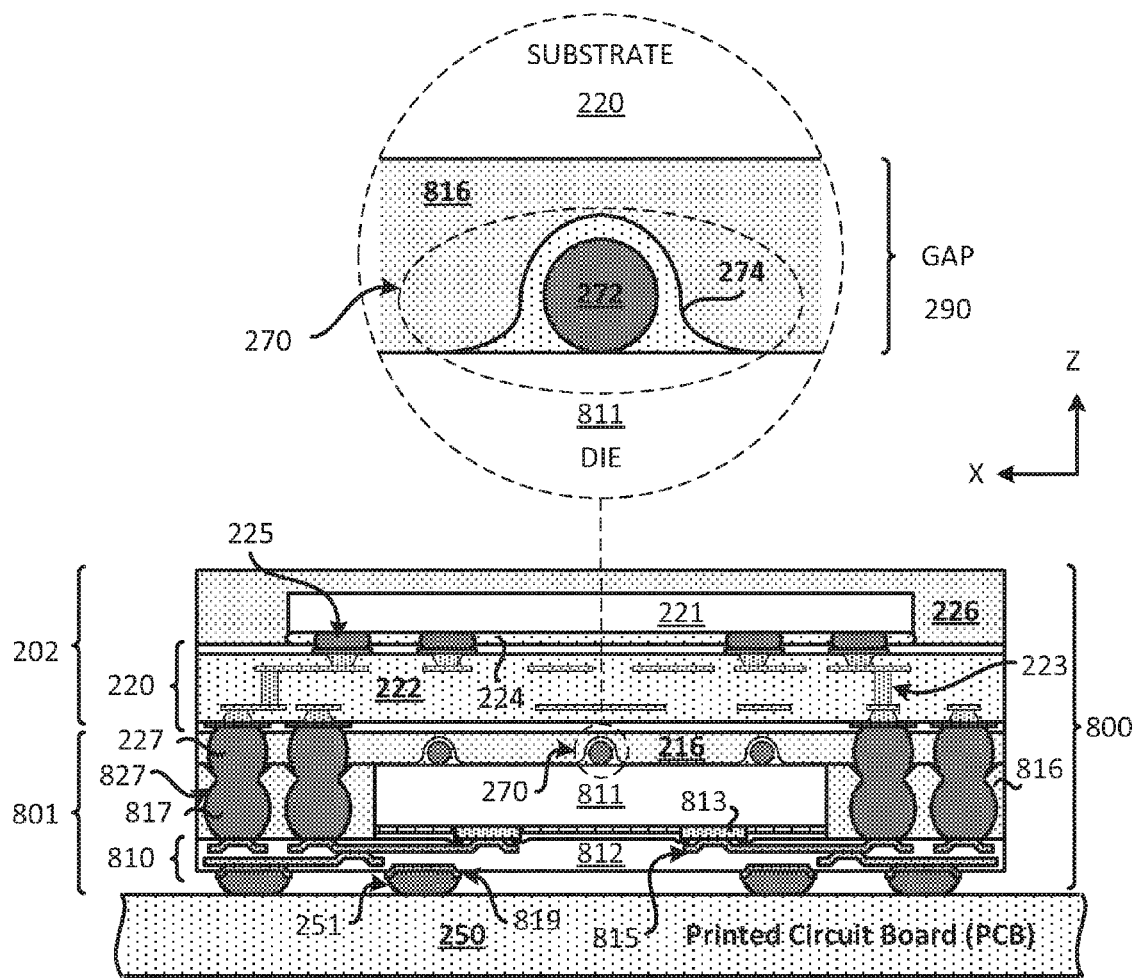
FIG. 8 illustrates a cross-sectional view of another package on package (PoP) device that includes a gap controller.

FIG. 8 illustrates another package on package (PoP) device 800 that includes a first package 801, the second package 202, and the gap controller 270. The second package 202 is coupled to the first package 801. The package on package (PoP) device 800 is coupled to a printed circuit board (PCB) 250 through the plurality of solder balls 251. The package on package (PoP) device 800 is similar to the package on package (PoP) device 600, except that the first package 801 has a different configuration. In particular, the first package 801 includes a wafer level package (WLP).

In some implementations, the gap controller 270 is located between the first package 801 and the second package 202. In some implementations, the gap controller 270 is located between an electronic package component (e.g., first die 811) of the first package 801 and the second package 202.

As described above and further described below, in some implementations, the gap controller 270 is configured to provide mechanical support for the second package 202 (e.g., second package substrate 220 of the second package 202). Thus, in some implementations, the gap controller 270 may be configured to operate as a back stop for any warpage, deformation and/or deflection in the second package 202.

In some implementations, the gap controller 270 is configured to ensure that there is enough distance, space or gap between a die of the first package 801, and a package substrate of the second package 202, so that an encapsulation layer can be provided (e.g., formed) in the space or the gap between the die of the first package 801, and the package substrate of the second package 202.

The first package 801 may include a fan out wafer level package (FOWLP). The first package 801 includes a first redistribution portion 810, a first die 811, a first encapsulation layer 216, and an encapsulation layer 816. The first redistribution portion 810 may be a fan out portion (e.g. for fanning or routing of signaling to and from devices with different I/O pitches). The first package 801 may also include the plurality of package interconnects 827. The plurality of package interconnects 827 may include a plurality of package interconnects 817 and the plurality of package interconnects 227. The plurality of package interconnects 827 may include a solder interconnect (e.g., solder ball).

The first redistribution portion 810 includes at least one dielectric layer 812, at least one redistribution layer 815, and at least one underbump metallization (UBM) layer 819. A redistribution layer (e.g. 815) may redistribute signaling from I/O pads of a die to other parts of the package. The at least one redistribution layer 815 is coupled to the at least one UBM layer 819. The at least one UBM layer 819 is coupled to the plurality of solder balls 251. In some implementations, the at least one UBM layer 819 may be optional. In such instances, the plurality of solder balls 251 may be coupled to the at least one redistribution layer 815.

The first die 811 may be an integrated circuit (IC) that includes a plurality of transistors and/or other electronic components. The first die 811 may be a logic die and/or a memory die. The first die 811 may be a bare die. The first die 811 may include the pad 813. The first die 811 is coupled to the first redistribution portion 810. In particular, the pad 813 of the first die 811 is coupled to the at least one redistribution layer 815.

The encapsulation layer 816 at least partially encapsulates the first die 811 and the plurality of package interconnects 827. For example, the encapsulation layer 816 may at least partially encapsulate the first die 811 and the plurality of package interconnects 817. In some implementations, a surface of the encapsulation layer 816 may be substantially co-planar with a surface (e.g., back side surface) of the first die 811. The first encapsulation layer 216 is formed over the first die 811 and the encapsulation layer 816. The encapsulation layer 816 may be the same material or a different material as the first encapsulation layer 216. The first encapsulation layer 216 at least partially encapsulates the gap controller 270 and the plurality of package interconnects 827. The first encapsulation layer 216 is optional.

The second package 202 is coupled to the first package 801 through the plurality of package interconnects 827, which includes the plurality of package interconnects 227 and the plurality of package interconnects 817. The plurality of package interconnects 827 may include a solder interconnect (e.g., solder ball). The plurality of package interconnects 827 is coupled to the first redistribution portion 810 and the second package substrate 220. In particular, the plurality of package interconnects 827 is coupled to the at least one redistribution layer 815 (of the first redistribution portion 810) and the plurality of second interconnects 223 (of the second package substrate 220). In some implementations, the plurality of package interconnects 227 is coupled to the plurality of second interconnects 223 and the plurality of package interconnects 817. The plurality of package interconnects 817 is coupled to the at least one redistribution layer 815 of the first redistribution portion 810.

The gap controller 270 is located over the first die 811 (e.g., back side of the first die 811). In particular, the gap controller 270 is located between the first die 811 of the first package 801, and the second package substrate 220 of the second package 202. In some implementations, the gap controller 270 is configured to provide a minimum distance, a minimum space, and/or a minimum gap between the first die 811 of the first package 801, and the second package substrate 220 of the second package 202. In some implementations, the minimum distance, the minimum space, the minimum gap ensures that there is enough room for the first encapsulation layer 216 to flow (e.g., during a fabrication process) between the first die 811 of the first package 801, and the second package substrate 220 of the second package 202, even when there is warpage, deformation, and/or deflection of the second package substrate 220. Thus, in some implementations, at least one gap controller 270 that is located over the first die 811 (e.g., over a back side of the first die 811) ensures that a sufficient amount of the first encapsulation layer 216 is formed between the first die 811 and the second package substrate 220 (of the second package 202).

Exemplary Package on Package (PoP) Device Comprising a Gap Controller

Figure 9:
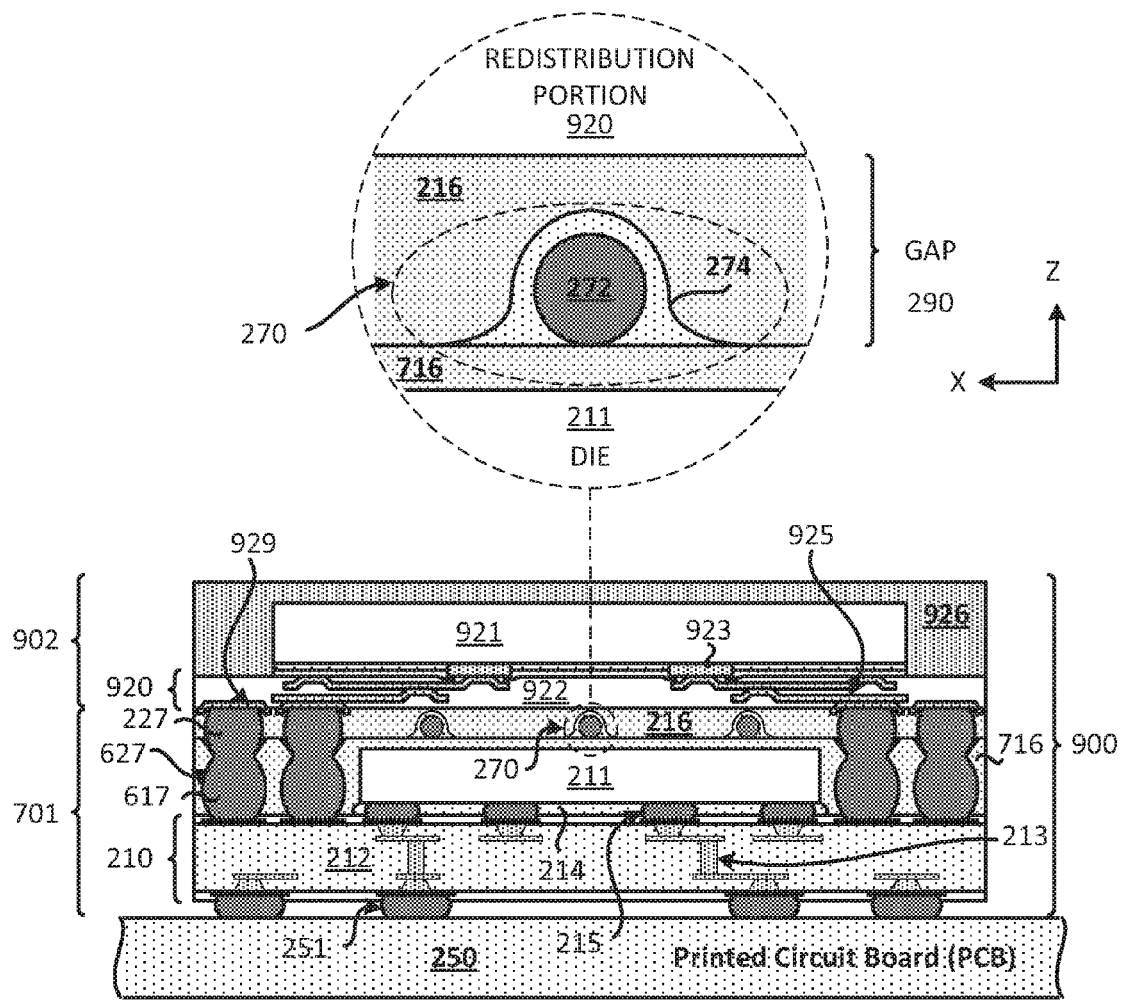
FIG. 9 illustrates a cross-sectional view of another package on package (PoP) device that includes a gap controller.

FIG. 9 illustrates another package on package (PoP) device 900 that includes the first package 701, a second package 902, and the gap controller 270. The second package 902 is coupled to the first package 701. The first package 701 may be a first integrated circuit (IC) package. The package on package (PoP) device 900 is coupled to a printed circuit board (PCB) 250 through the plurality of solder balls 251. The package on package (PoP) device 900 is similar to the package on package (PoP) device 700 of FIG. 7, except that the second package 902 has a different configuration. In particular, the second package 902 includes a wafer level package (WLP).

In some implementations, the gap controller 270 is located between the first package 701 and the second package 902. In some implementations, the gap controller 270 is located between an electronic package component (e.g., first die 211) of the first package 701 and the second package 902.

As described below, in some implementations, the gap controller 270 is configured to provide mechanical support for the second package 902 (e.g., second redistribution portion 920 of the second package 902). Thus, in some implementations, the gap controller 270 may be configured to operate as a back stop for any warpage, deformation and/or deflection in the second package 902.

In some implementations, the gap controller 270 is configured to ensure that there is enough distance, space or gap between a die of the first package 701, and a redistribution portion of the second package 902, so that an encapsulation layer can be provided (e.g., formed) in the space or the gap between the die of the first package 701, and the redistribution portion of the second package 902.

The first package 701 includes the first package substrate 210, the first die 211, the first underfill 214, the plurality of first solder balls 215, the first encapsulation layer 216, the gap controller 270, and the encapsulation layer 716. Thus, the first package 701 includes two encapsulation layers (e.g., 216, 716). The first encapsulation layer 216 is optional. In some implementations, the first package 701 may also include the plurality of package interconnects 627. The plurality of package interconnects 627 may include the plurality of package interconnects 617 and the plurality of package interconnects 227.

The second package 902 may include a fan out wafer level package (FOWLP). The second package 902 includes a second redistribution portion 920, a second die 921, and a second encapsulation layer 926. The second redistribution portion 920 may be a fan out portion (e.g. for fanning or routing of signaling to and from devices with different I/O pitches).

The second redistribution portion 920 includes at least one dielectric layer 922, at least one redistribution layer 925, and at least one underbump metallization (UBM) layer 929. A redistribution layer (e.g. 925) may redistribute signaling from I/O pads of a die to other parts of the package. The at least one redistribution layer 925 is coupled to the at least one UBM layer 929. The at least one UBM layer 929 is coupled to the plurality of package interconnects 227 (e.g., solder ball). In some implementations, the at least one UBM layer 929 may be optional. In such instances, the plurality of package interconnects 227 may be coupled to the at least one redistribution layer 925.

The second die 921 may be an integrated circuit (IC) that includes a plurality of transistors and/or other electronic components. The second die 921 may be a logic die and/or a memory die. The second die 921 may be a bare die. The second die 921 may include the pad 923. The second die 921 is coupled to the second redistribution portion 920. In particular, the pad 923 of the second die 921 is coupled to the at least one redistribution layer 925.

The second encapsulation layer 926 at least partially encapsulates the second die 921. The second encapsulation layer 926 is coupled to the second redistribution portion 920. Different implementations may use different materials for the second encapsulation layer 926. For example, the second encapsulation layer 926 may include a mold and/or an epoxy fill.

As shown in FIG. 9, the gap controller 270 is located over the encapsulation layer 716. In particular, the gap controller 270 is located between the first die 211 of the first package 701, and the second redistribution portion 920 of the second package 902. In some implementations, the gap controller 270 is configured to provide a minimum distance, a minimum space, and/or a minimum gap between the encapsulation layer 716 over the first die 211 of the first package 701, and the second redistribution portion 920 of the second package 902. In some implementations, the minimum distance, the minimum space, the minimum gap ensures that there is enough room for the first encapsulation layer 216 to flow (e.g., during a fabrication process) between the encapsulation layer 716 over first die 211 of the first package 701, and the second redistribution portion 920 of the second package 902, even when there is warpage, deformation, and/or deflection of the second redistribution portion 920. Thus, in some implementations, at least one gap controller 270 that is located over the encapsulation layer 716 on the first die 211 ensures that a sufficient amount of the first encapsulation layer 216 is formed between the encapsulation layer 716 over the first die 211 and the second redistribution portion 920 (of the second package 902).

FIG. 9 illustrates that the gap controller 270 is not in direct physical contact with the first die 211 nor the second package 902 (e.g., second redistribution portion 920 of the second package 902). In some implementations, a surface of the encapsulation layer 716 may be co-planar with a surface (e.g., top surface) of the first die 211, for example, as described in FIG. 6. In such instances, the gap controller 270 may be located over the first die 211 and in physical contact with the first die 211.

FIG. 9 also illustrates that the gap controller 270 is configured to provide a gap 290 (e.g., minimum gap) between the encapsulation layer 716 over the first die 211, and the second package 902 (e.g., bottom surface of the second redistribution portion 920 of the second package 902). In some implementations, a gap between the first die 211 and the second package 902 (e.g., second redistribution portion 920 of the second package 902) may include the gap 290 and a thickness of the encapsulation layer 716 over the first die 211.

Exemplary Package on Package (PoP) Device Comprising a Gap Controller

Figure 10:
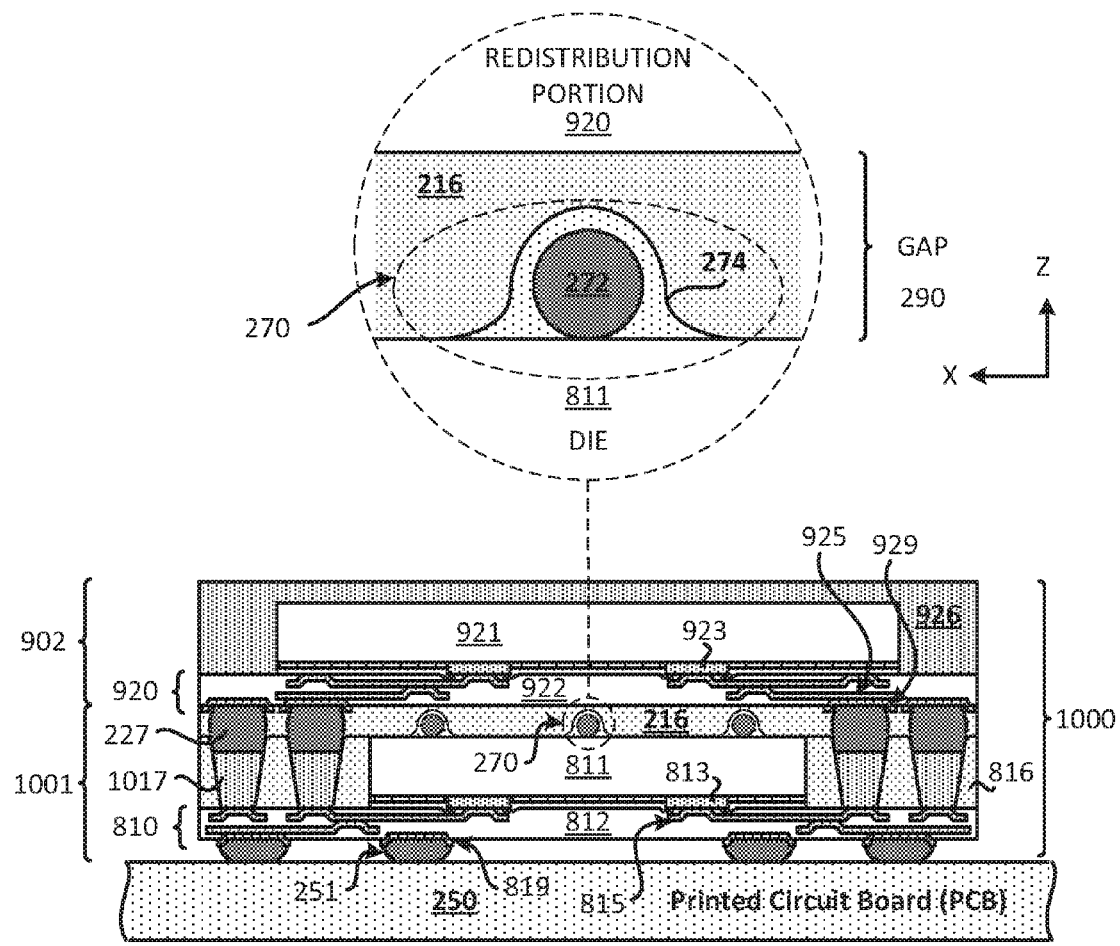
FIG. 10 illustrates a cross-sectional view of another package on package (PoP) device that includes a gap controller.

FIG. 10 illustrates another package on package (PoP) device 1000 that includes a first package 1001, the second package 902, and the gap controller 270. The second package 902 is coupled to the first package 1001. The package on package (PoP) device 1000 is coupled to a printed circuit board (PCB) 250 through the plurality of solder balls 251. The package on package (PoP) device 1000 is similar to the package on package (PoP) device 900, except that the first package 1001 has a different configuration. In particular, the first package 1001 includes a wafer level package (WLP). Thus, the package on package (PoP) device 1000 of FIG. 10 includes two wafer level packages (WLPs).

In some implementations, the gap controller 270 is located between the first package 1001 and the second package 902. In some implementations, the gap controller 270 is located between an electronic package component (e.g., first die 811) of the first package 1001 and the second package 902.

As described above and further described below, in some implementations, the gap controller 270 is configured to provide mechanical support for the second package 902 (e.g., second redistribution portion 920 of the second package 902). Thus, in some implementations, the gap controller 270 may be configured to operate as a back stop for any warpage, deformation and/or deflection in the second package 902.

In some implementations, the gap controller 270 is configured to ensure that there is enough distance, space or gap between a die of the first package 1001, and a redistribution portion of the second package 902, so that an encapsulation layer can be provided (e.g., formed) in the space or the gap between the die of the first package 1001, and the redistribution portion of the second package 902.

The first package 1001 may include a fan out wafer level package (FOWLP). The first package 1001 includes the first redistribution portion 810, the first die 811, the first encapsulation layer 216, the encapsulation layer 816, and a plurality of interconnects 1017 (e.g., vias). The first redistribution portion 810 may be a fan out portion (e.g. for fanning or routing of signaling to and from devices with different I/O pitches). The first package 1001 may also include the plurality of package interconnects 227.

The first redistribution portion 810 includes at least one dielectric layer 812, at least one redistribution layer 815, and at least one underbump metallization (UBM) layer 819. A redistribution layer (e.g. 815) may redistribute signaling from I/O pads of a die to other parts of the package. The at least one redistribution layer 815 is coupled to the at least one UBM layer 819. The at least one UBM layer 819 is coupled to the plurality of solder balls 251. In some implementations, the at least one UBM layer 819 may be optional. In such instances, the plurality of solder balls 251 may be coupled to the at least one redistribution layer 815.

The first die 811 may be an integrated circuit (IC) that includes a plurality of transistors and/or other electronic components. The first die 811 may be a logic die and/or a memory die. The first die 811 may be a bare die. The first die 811 may include the pad 813. The first die 811 is coupled to the first redistribution portion 810. In particular, the pad 813 of the first die 811 is coupled to the at least one redistribution layer 815.

The plurality of interconnects 1017 traverses the encapsulation layer 816. The plurality of interconnects 1017 is coupled to the first redistribution portion 810. In particular, the plurality of interconnects 1017 is coupled to the at least one redistribution layer 815.

The encapsulation layer 816 at least partially encapsulates the first die 811 and the plurality of interconnects 1017. In some implementations, a surface of the encapsulation layer 816 may be substantially co-planar with a surface (e.g., back side surface) of the first die 811. The first encapsulation layer 216 is formed over the first die 811 and the encapsulation layer 816. The encapsulation layer 816 may be the same material or a different material as the first encapsulation layer 216. The first encapsulation layer 216 at least partially encapsulates the gap controller 270 and the plurality of package interconnects 227 (e.g., solder balls). The first encapsulation layer 216 is optional.

The second package 902 may include a fan out wafer level package (FOWLP). The second package 902 includes the second redistribution portion 920, the second die 921, and the second encapsulation layer 926. The second redistribution portion 920 may be a fan out portion (e.g. for fanning or routing of signaling to and from devices with different I/O pitches).

The second package 902 is coupled to the first package 1001 through the plurality of package interconnects 227. The plurality of package interconnects 227 may include a solder interconnect (e.g., solder ball). The plurality of package interconnects 227 is coupled to the second redistribution portion 920 and the plurality of interconnects 1017 (e.g., vias) of the first package 1001. In particular, the plurality of package interconnects 227 is coupled to the UBM layer 929 and the plurality of interconnects 1017 (e.g., vias) of the first package 1001. In some implementations, the plurality of package interconnects 227 is coupled to the redistribution layer 925 and the plurality of interconnects 1017 (e.g., vias) of the first package 1001.

The gap controller 270 is located over the first die 811 (e.g., over back side of the first die 811). In particular, the gap controller 270 is located between the first die 811 of the first package 1001, and the second redistribution portion 920 of the second package 902. In some implementations, the gap controller 270 is configured to provide a minimum distance, a minimum space, and/or a minimum gap between the first die 811 of the first package 1001, and the second redistribution portion 920 of the second package 902. In some implementations, the minimum distance, the minimum space, the minimum gap ensures that there is enough room for the first encapsulation layer 216 to flow (e.g., during a fabrication process) between the first die 811 of the first package 1001, and the second redistribution portion 920 of the second package 902, even when there is warpage, deformation, and/or deflection of the second redistribution portion 920. Thus, in some implementations, at least one gap controller 270 that is located over the first die 811 (e.g., over a back side of the first die 811) ensures that a sufficient amount of the first encapsulation layer 216 is formed between the first die 811 and the second redistribution portion 920 (of the second package 902).

Having described various examples of package on package (PoP) devices that include a gap controller, various processes and methods for fabricating a package on package (PoP) device that includes a gap controller will now be described.

Exemplary Sequence for Fabricating a Package Comprising a Gap Controller

Figure 11A:
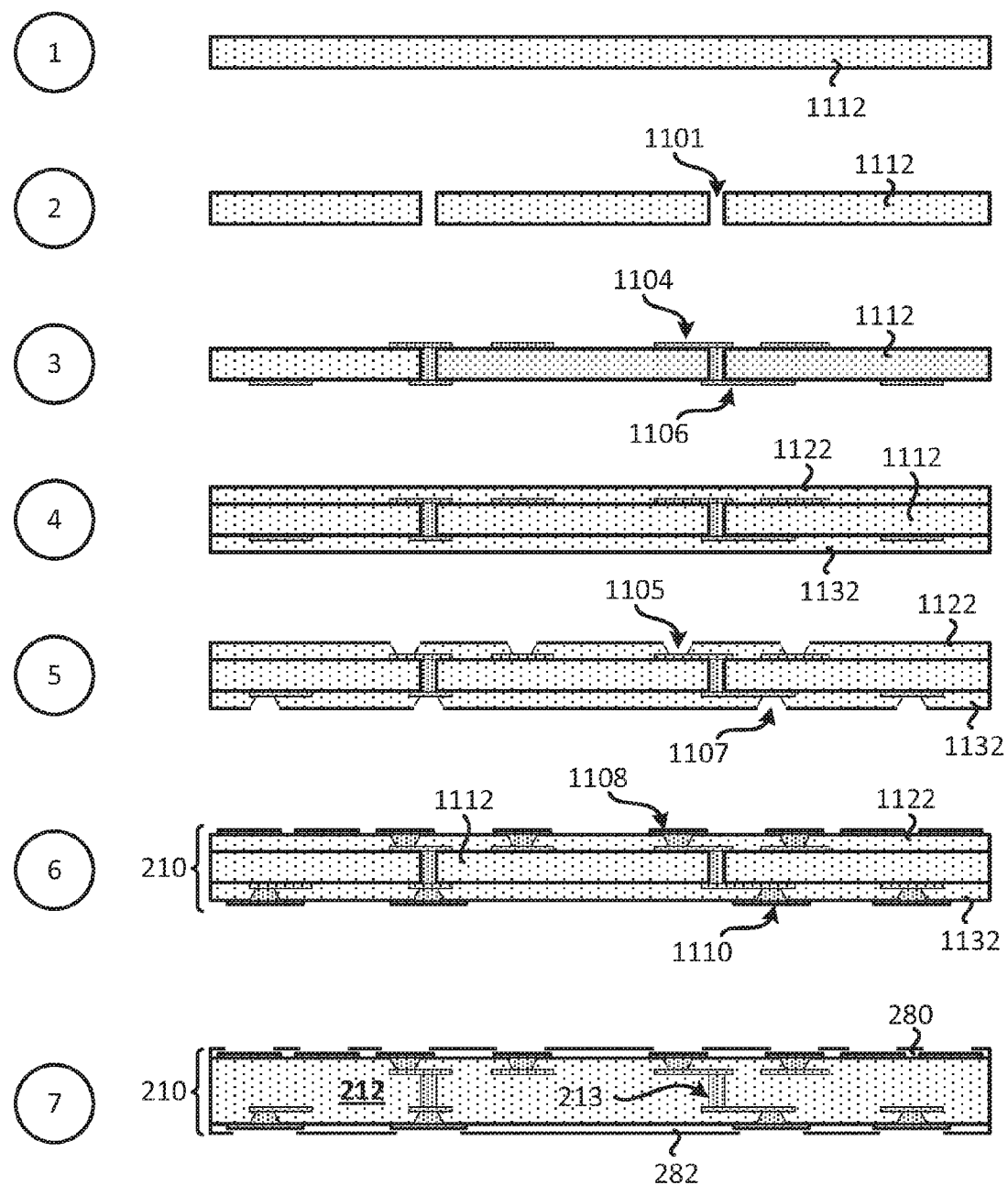
FIG. 11 (which comprises FIGS. 11A-11C) illustrates an example of a sequence for fabricating a package that includes a gap controller.
Figure 11B:
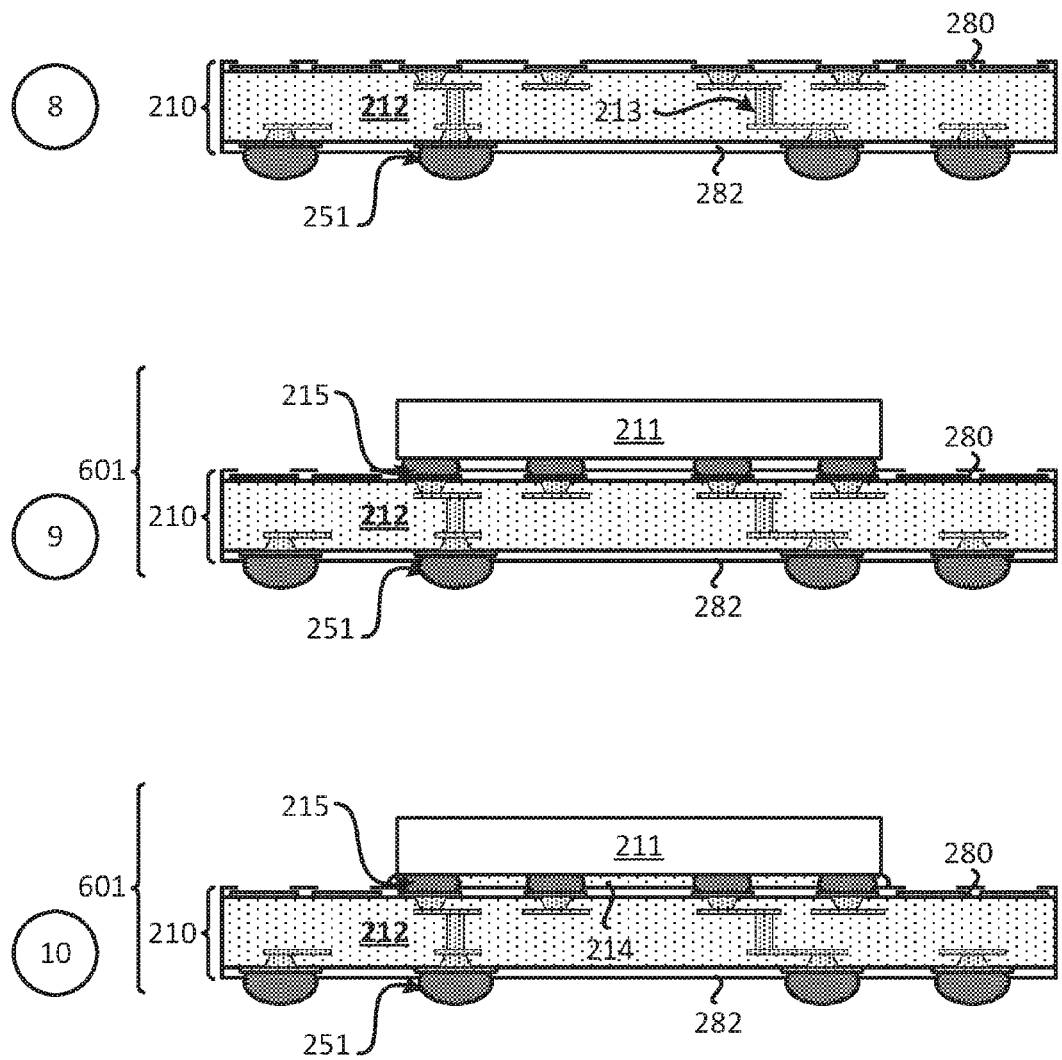
Figure 11C:
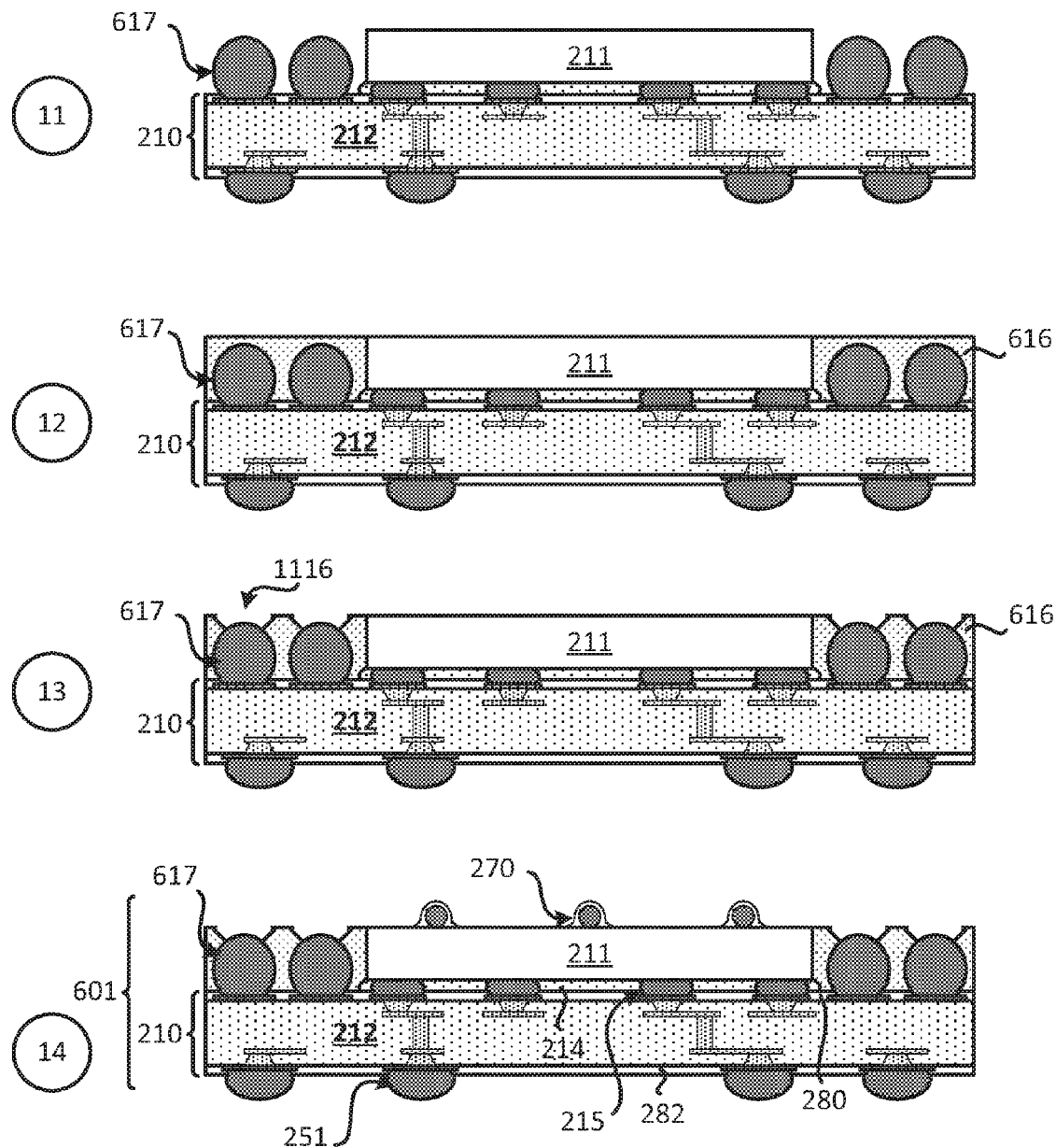

In some implementations, providing/fabricating a package that includes a gap controller includes several processes. FIG. 11 (which includes FIGS. 11A-11C) illustrates an exemplary sequence for providing/fabricating a package that includes a gap controller. In some implementations, the sequence of FIGS. 11A-11C may be used to fabricate the package (e.g., integrated circuit (IC) package) that includes a gap controller of FIGS. 2 and 6-9 and/or other packages described in the present disclosure. However, for the purpose of simplification, FIGS. 11A-11C will be described in the context of providing/fabricating a package of FIG. 6. In particular, FIGS. 11A-11C will be described in the context of fabricating the first package 601 of FIG. 6.

It should be noted that the sequence of FIGS. 11A-11C may combine one or more stages in order to simplify and/or clarify the sequence for providing a package. In some implementations, the order of the processes may be changed or modified.

Stage 1, as shown in FIG. 11A, illustrates a state after a first dielectric layer 1112 is provided. The first dielectric layer 1112 may be a core layer. The first dielectric layer 1112 may be formed or provided by a supplier.

Stage 2 illustrates a state after at least one cavity 1101 is formed in the first dielectric layer 1112. Different implementations may form the cavity 1101 in the first dielectric layer 1112. A laser process and/or a photo-lithography process may be used to form the cavity 1101.

Stage 3 illustrates a state a first metal layer 1104 and a second metal layer 1106 are formed on and/or in the first dielectric layer 1112. The first metal layer 1104 and the second metal layer 1106 may represent the plurality of first interconnects 213, as described above in at least FIG. 6.

Stage 4 illustrates a state after a second dielectric layer 1122 and a third dielectric layer 1132 are formed on the first dielectric layer 1112.

Stage 5 illustrates a state after at least one cavity 1105 is formed in the second dielectric layer 1122, and at least one cavity 1107 is formed in the third dielectric layer 1132. Different implementations may form the cavity 1105 in the second dielectric layer 1122 and the cavity 1107 in the third dielectric layer 1132. A laser process and/or a photo-lithography process may be used to form the cavity 1105 and/or the cavity 1107.

Stage 6 illustrates a state a third metal layer 1108 is formed on and/or in the second dielectric layer 1122, a fourth metal layer 1110 is formed on and/or in the third dielectric layer 1132. The third metal layer 1108 and the fourth metal layer 1110 may represent the plurality of first interconnects 213, as described above in at least FIG. 6. Stage 6 may represent a package substrate (e.g., first package substrate 210) that includes at least one dielectric layer and a plurality of first interconnects.

Stage 7 illustrates a state after a first solder resist layer 280 is formed over the dielectric layer 212, and a second solder resist layer 282 is formed over the dielectric layer 212. The dielectric layer 212 may collectively represent the first dielectric layer 1112, the second dielectric layer 1122, and the third dielectric layer 1132. Stage 7 may represent a package substrate (e.g., first package substrate 210) that includes the dielectric layer 212, the plurality of first interconnects 213, the first solder resist layer 280, and the second solder resist layer 282.

Stage 8, as shown in FIG. 11B, illustrates a state after the plurality of solder balls 251 is coupled to the first package substrate 210. In particular, the plurality of solder balls 252 is coupled to the plurality of first interconnects 213.

Stage 9 illustrates a state after the first die 211 is coupled to the first package substrate 210, through the plurality of first solder balls 215. Different implementations may couple the first die 211 to the first package substrate 210 differently (e.g., by using interconnect pillars). In some implementations, a reflow process (e.g., chip attach reflow process) may be used to couple the first die 211 to the first package substrate 210. In some implementations, a reflux process may be used after the reflow process.

Stage 10 illustrates a state after a first underfill 214 is provided between the first die 211 and the first package substrate 210. The first underfill 214 may at least partially surround the plurality of first solder balls 215. In some implementations, providing the first underfill 214 includes an underfill dispense process.

Stage 11, as shown in FIG. 11C, illustrates a state after a plurality of package interconnects 617 is provided (e.g., formed) over the first package substrate 210. The plurality of package interconnects 617 may include a solder interconnect.

Stage 12 illustrates a state after an encapsulation layer 616 is at least partially formed over the first die 211, the first package substrate 210, and the plurality of package interconnects 617. In some implementations, the encapsulation layer 616 at least partially encapsulates the first die 211 and the plurality of package interconnects 617. In some implementations, the first die 211 is completely encapsulated by the encapsulation layer 616 and the encapsulation layer 616 is grinded down such that a top surface of the encapsulation layer 616 is substantially co-planar with a surface (e.g., back side surface) of the first die 211.

Stage 13 illustrates a state after at least one cavity 1116 is formed in the encapsulation layer 616. The cavity 1116 may be formed to at least partially expose the plurality of package interconnects 617. A laser process and/or a photo-lithography process may be used to form the cavity 1116.

Stage 14 illustrates a state after at least one gap controller 270 is coupled to the first die 211 (e.g., to the back side surface of the first die 211). Stage 14 illustrates in some implementations, a first package 601 that includes a first package substrate 210, a first die 211, a plurality of package interconnects 617, an encapsulation layer 616, and at least one gap controller 270. In some implementations, the at least one gap controller 270 is deposited on the first die 211.

In some implementations, several first packages are concurrently fabricated on wafer, and a singulation process is performed to cut a wafer into individual packages.

Figure 12:
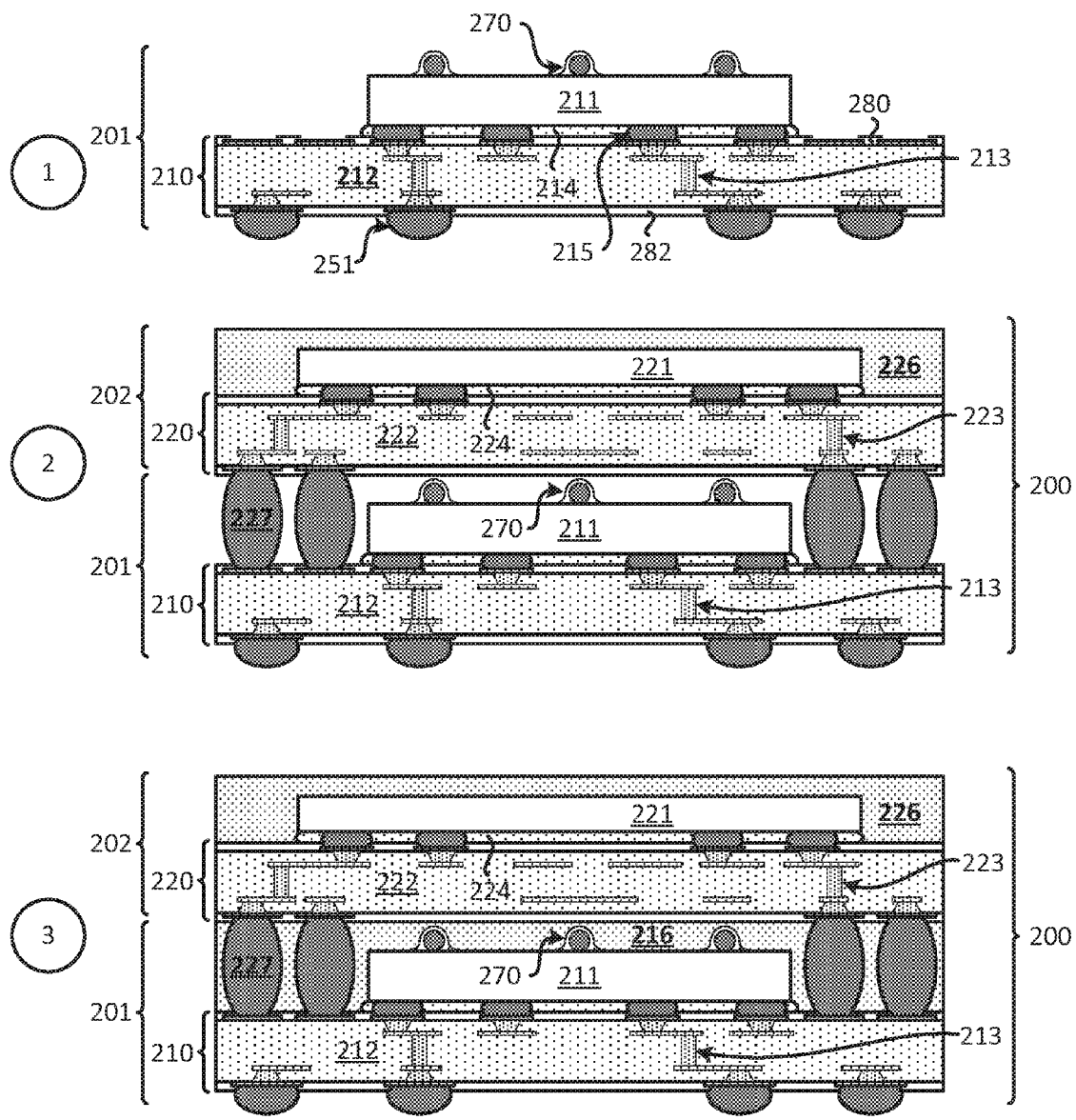
FIG. 12 illustrates an example of a sequence for fabricating a package on package (PoP) device that includes a gap controller.

Exemplary Sequence for Fabricating a Package on Package (PoP) Device Comprising a Gap Controller In some implementations, providing/fabricating a package on package (PoP) device that includes a gap controller includes several processes. FIG. 12 illustrates an exemplary sequence for providing/fabricating a package on package (PoP) device that includes a gap controller. In some implementations, the sequence of FIG. 12 may be used to fabricate the package on package (PoP) device that includes a gap controller of FIGS. 2 and 6-7 and/or other package on package (PoP) devices described in the present disclosure. However, for the purpose of simplification, FIG. 12 will be described in the context of providing/fabricating the package on package (PoP) device of FIG. 2.

It should be noted that the sequence of FIG. 12 may combine one or more stages in order to simplify and/or clarify the sequence for providing a package on package (PoP) device. In some implementations, the order of the processes may be changed or modified.

Stage 1, as shown in FIG. 12, illustrates a state after a first package 201 is provided. The first package 201 includes the first package substrate 210, the first die 211, the first underfill 214, and the gap controller 270. FIGS. 11A-11C illustrates an example of sequence for fabricating the first package 201.

Stage 2 illustrates a state after a second package 202 is coupled to the first package 201 through the plurality of package interconnects 227. The second package 202 includes the second package substrate 220, the second die 221, the second underfill 224, and the second encapsulation layer 226. The second package 202 may also include the plurality of package interconnects 227. The plurality of package interconnects 227 includes a solder interconnect (e.g., solder ball).

Stage 3 illustrates a state after a first encapsulation layer 216 is provided (e.g., formed) between the first package 201 and the second package 202. Stage 3 may illustrate a package on package (PoP) device 200 that includes the first package 201 and the second package 202. The first package 201 includes the first die 211, the gap controller 270, and the first encapsulation layer 216. The second package 202 may include the second package substrate 220.

As shown at stage 3, the first encapsulation layer 216 is formed between the back side surface of the first die 211 of the first package 201, and the bottom surface of the second package substrate 220 of the second package 202.

Exemplary Sequence for Fabricating a Package Comprising a Gap Controller

Figure 13A:
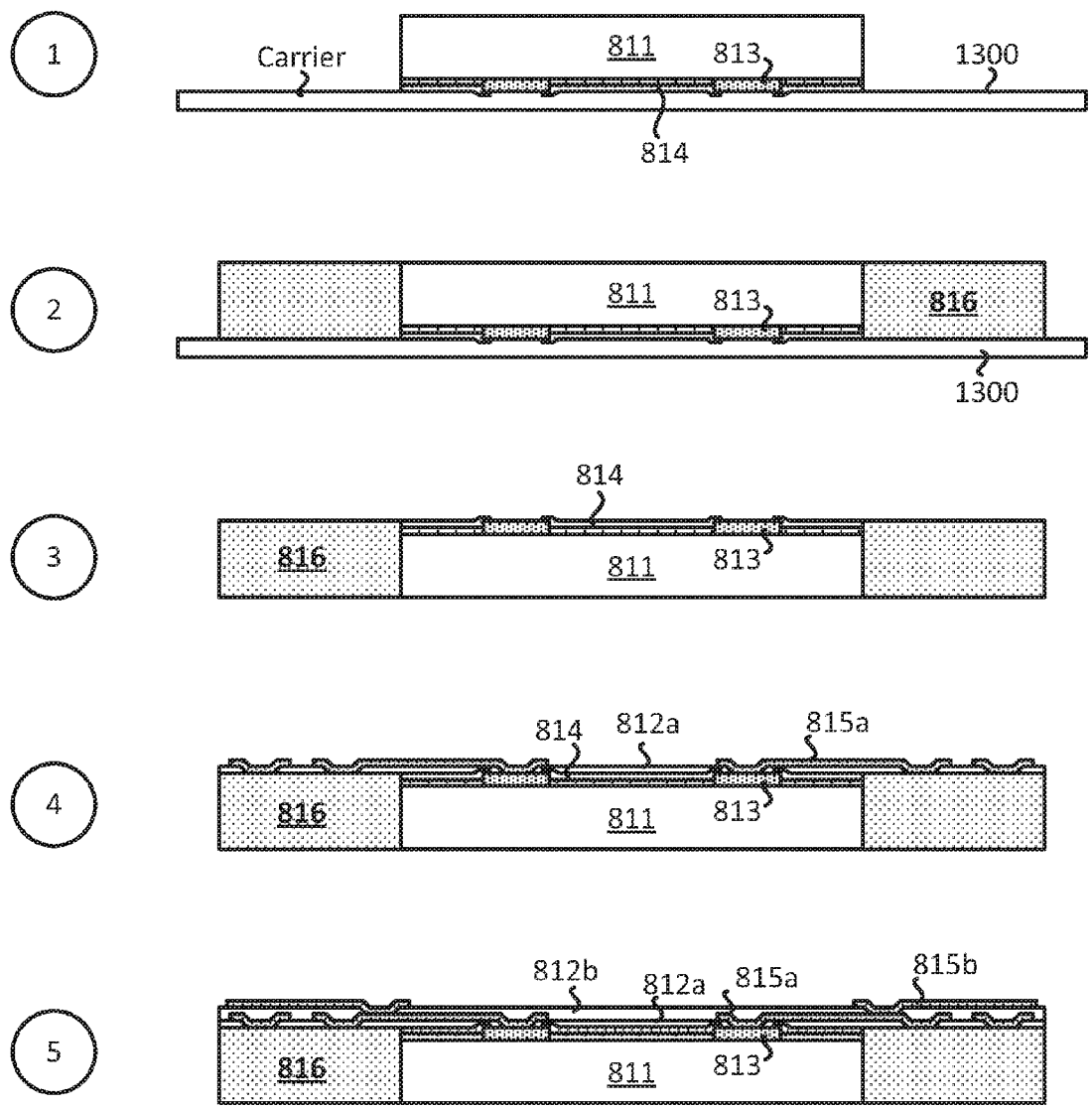
FIG. 13 (which comprises FIGS. 13A-13B) illustrates an example of a sequence for fabricating a package that includes a gap controller.
Figure 13B:
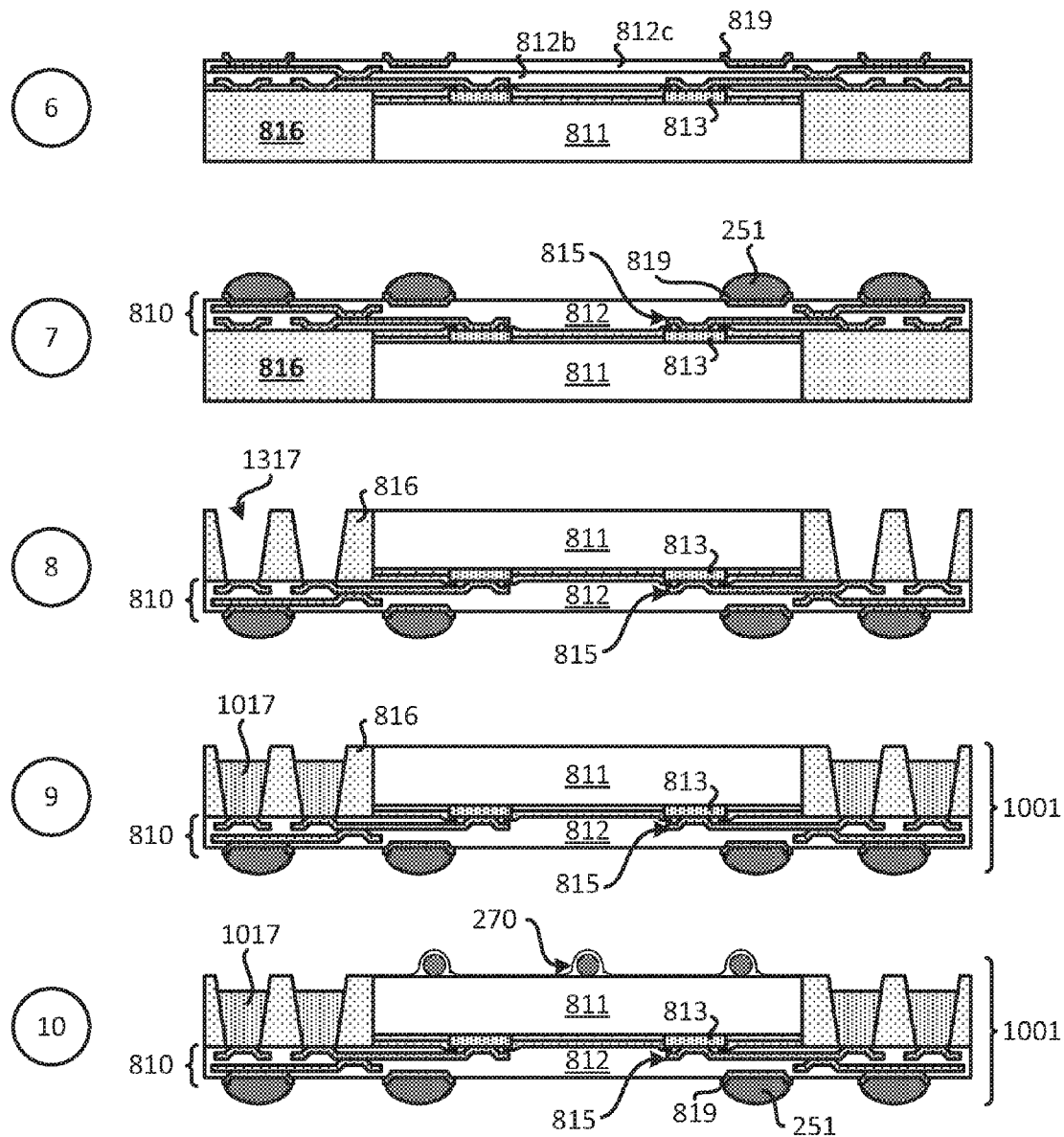

In some implementations, providing/fabricating a package that includes a gap controller includes several processes. FIG. 13 (which includes FIGS. 13A-13B) illustrates an exemplary sequence for providing/fabricating a package that includes a gap controller. In some implementations, the sequence of FIGS. 13A-13B may be used to fabricate a package (e.g., integrated circuit (IC) package) that includes a gap controller of FIGS. 8-10 and/or other packages described in the present disclosure. However, for the purpose of simplification, FIGS. 13A-13B will be described in the context of providing/fabricating the package of FIG. 10. In particular, FIGS. 13A-13B will be described in the context of fabricating the first package 1001 of FIG. 10. FIGS. 13A-13B may be used to fabricate a fan out wafer level package (FOWLP).

It should be noted that the sequence of FIGS. 13A-13B may combine one or more stages in order to simplify and/or clarify the sequence for providing a package. In some implementations, the order of the processes may be changed or modified.

Stage 1, as shown in FIG. 13A, illustrates a state after a first die 811 is coupled to a carrier 1300. The first die 811 includes a pad 813 and at least one passivation layer 814. The carrier 1300 may be an adhesive tape layer.

Stage 2 illustrates a state after an encapsulation layer 816 is formed over the first die 811. The encapsulation layer 816 may at least partially encapsulate the first die 811. The encapsulation layer 816 is formed such that a surface of the encapsulation layer 816 is substantially co-planar with a back side surface of the first die 811. In some implementations, the encapsulation layer 816 may be formed differently around the first die 811.

Stage 3 illustrates a state after the first die 811 and the encapsulation layer 816 are decoupled (e.g., detached) from the carrier 1300.

Stage 4 illustrates a state after a first dielectric layer 812a and a first redistribution layer 815a are formed over the first die 811 and the encapsulation layer 816. The first dielectric layer 812a is formed over the passivation layer 814 of the first die 811. The first redistribution layer 815a is formed such that the first redistribution layer 815a is coupled to the pad 813 of the first die 811.

Stage 5 illustrates a state after a second dielectric layer 812b is formed over the first dielectric layer 812a and the first redistribution layer 815a. Stage 5 also illustrates a state after a second redistribution layer 815b is formed over and coupled to the first redistribution layer 815a. The first redistribution layer 815a and the second redistribution layer 815b may represent the redistribution layer 815.

Stage 6, as shown in FIG. 13B, illustrates a state after a third dielectric layer 812c is formed over the second dielectric layer 812b and the second redistribution layer 815b. Stage 6 also illustrates a state after a UBM layer 819 is formed over and coupled to the second redistribution layer 815b. The first dielectric layer 812a, the second dielectric layer 812b and the third dielectric layer 812c may represent the dielectric layer 812.

Stage 7 illustrates a state after a plurality of solder balls 251 is coupled to the UBM layer 819. In some implementations, the UBM layer 819 may be optional. In such instances, the plurality of solder balls 851 may be coupled to the redistribution layer 815.

Stage 8 illustrates a state after at least one cavity 1317 is formed in the encapsulation layer 816. Different implementations may form the cavity 1317 in the encapsulation layer 816 differently. A laser process and/or a photo-lithography process may be used to form the cavity 1317. Stage 8 illustrates a first redistribution portion 810 that includes the dielectric layer 812, the redistribution layer 815 and the UBM layer 819.

Stage 9 illustrates a state after a plurality of interconnects 1017 is formed in the cavity 1317 of the encapsulation layer 816. The plurality of interconnects 1017 may include a via. A plating process may be used to form the plurality of interconnects 1017.

Stage 10 illustrates a state after at least one gap controller 270 is coupled to the first die 811 (e.g., to the back side surface of the first die 811). Stage 14 illustrates in some implementations, a first package 1001 that includes the first redistribution portion 810, the first die 811, the encapsulation layer 816, the plurality of interconnects 1017, and at least one gap controller 270.

In some implementations, several first packages are concurrently fabricated on wafer, and a singulation process is performed to cut a wafer into individual packages.

Figure 14:
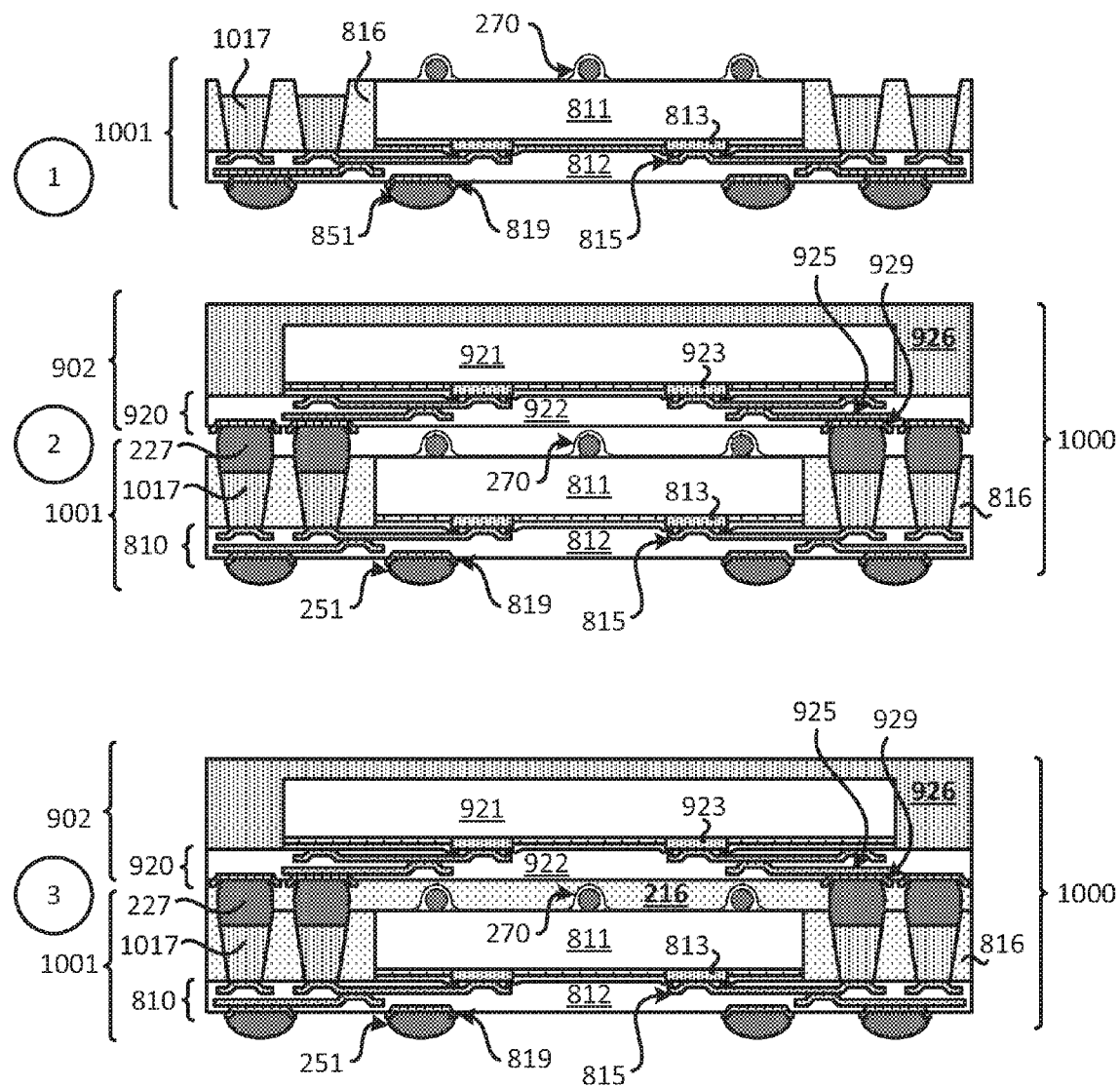
FIG. 14 illustrates an example of a sequence for fabricating a package on package (PoP) device that includes a gap controller.

Exemplary Sequence for Fabricating a Package on Package (PoP) Device Comprising a Gap Controller In some implementations, providing/fabricating a package on package (PoP) device that includes a gap controller includes several processes. FIG. 14 illustrates an exemplary sequence for providing/fabricating a package on package (PoP) device that includes a gap controller. In some implementations, the sequence of FIG. 14 may be used to fabricate the package on package (PoP) device that includes a gap controller of FIG. 10 and/or other package on package (PoP) devices described in the present disclosure. However, for the purpose of simplification, FIG. 14 will be described in the context of providing/fabricating the package on package (PoP) device of FIG. 10.

It should be noted that the sequence of FIG. 14 may combine one or more stages in order to simplify and/or clarify the sequence for providing a package on package (PoP) device. In some implementations, the order of the processes may be changed or modified.

Stage 1, as shown in FIG. 14, illustrates a state after a first package 1001 is provided. The first package 1001 may be a fan out wafer level package (FOWLP). The first package 1001 includes the first redistribution portion 810, at least one redistribution layer 815, at least one UBM layer 819, the first die 811, the pad 813, and the gap controller 270. FIGS. 13A-13B illustrate an example of a sequence for fabricating the first package 1001.

Stage 2 illustrates a state after a second package 902 is coupled to the first package 1001 through the plurality of package interconnects 227. The second package 902 includes the second redistribution portion 920, at least one redistribution layer 925, at least one UBM layer 929, the second die 921, and the pad 923. The second package 902 may also include the plurality of package interconnects 227. The plurality of package interconnects 227 includes a solder interconnect (e.g., solder ball).

Stage 3 illustrates a state after a first encapsulation layer 216 is provided (e.g., formed) between the first package 1001 and the second package 902. Stage 3 may illustrate a package on package (PoP) device 1000 that includes the first package 1001 and the second package 902. The first package 1001 includes the first die 811, the gap controller 270, and the first encapsulation layer 216. The second package 902 may include the second redistribution portion 920.

As shown at stage 3, the first encapsulation layer 216 is formed between the back side surface of the first die 811 of the first package 1001, and the bottom surface of the second redistribution portion 920 of the second package 902.

Figure 15:
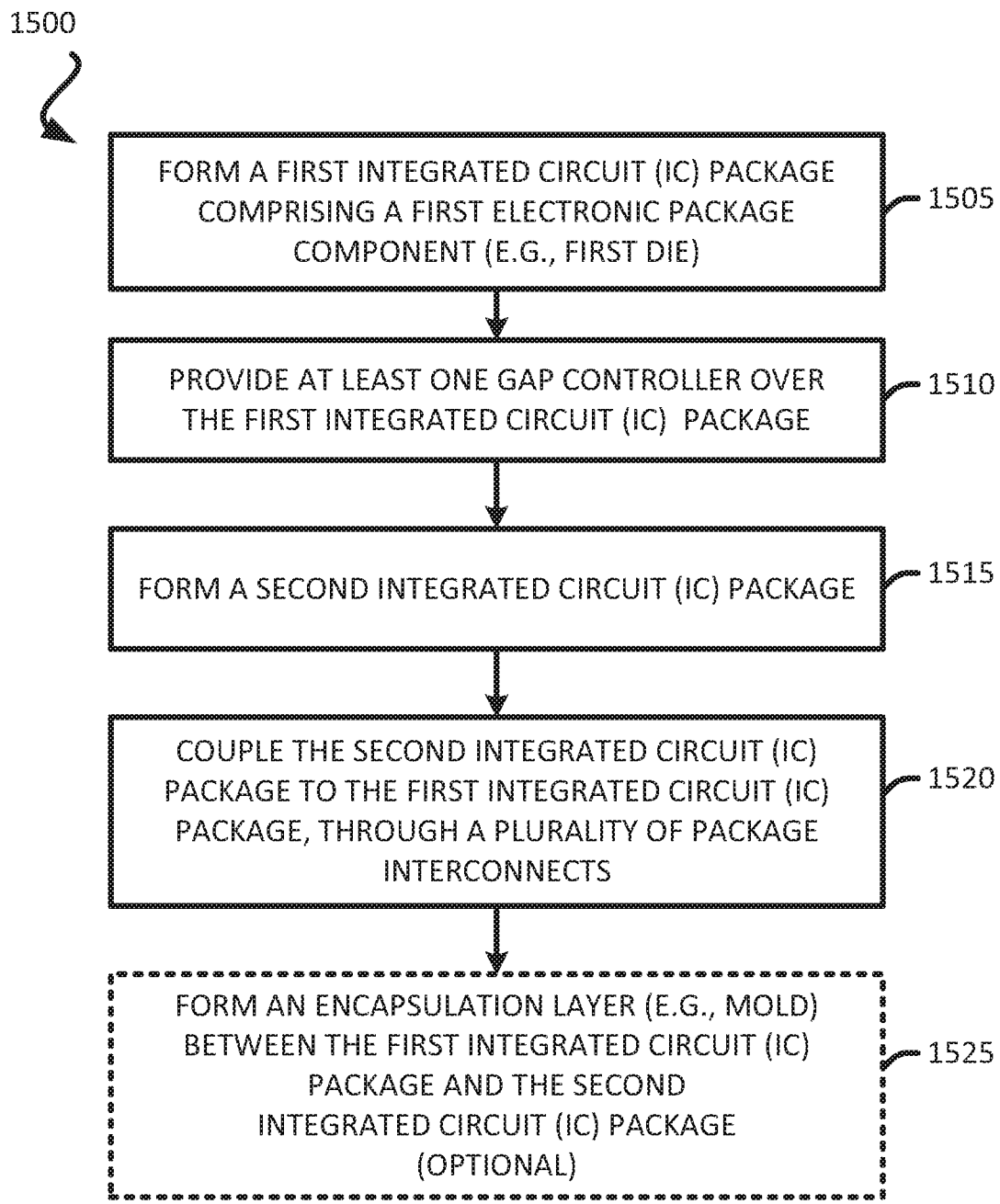
FIG. 15 illustrates a flow diagram of an exemplary method for fabricating a package on package (PoP) device that includes a gap controller.

Exemplary Method for Fabricating a Package on Package (PoP) Device Comprising a Gap Controller In some implementations, providing/fabricating a package on package (PoP) that includes a gap controller includes several processes. FIG. 15 illustrates an exemplary flow diagram of a method for providing/fabricating package on package (PoP) that includes a gap controller. In some implementations, the method of FIG. 15 may be used to provide/fabricate the package on package (PoP) that includes a gap controller of FIGS. 2, 6-10 and/or other package on package (PoP) devices described in the present disclosure. However, for the purpose of simplification, FIG. 15 will be described in the context of providing/fabricating the device package of FIG. 2.

It should be noted that the flow diagram of FIG. 15 may combine one or more processes in order to simplify and/or clarify the method for providing a package on package (PoP) device. In some implementations, the order of the processes may be changed or modified.

The method forms (at 1505) a first integrated circuit (IC) package that includes a first electronic package component (e.g., first die). Examples of forming a first integrated circuit (IC) package are illustrated and described in FIGS. 11A-11C and 13A-13B. In some implementations, the first integrated circuit (IC) package may include a fan out wafer level package (FOWLP). The first integrated circuit (IC) package may include a package substrate or a redistribution portion. The first integrated circuit (IC) package may include an encapsulation layer. Examples of a first package (e.g., first integrated circuit (IC) package) include the first package 201, the first package 601, the first package 701, the first package 801, and the first package 1001.

The method provides (at 1510) at least one gap controller over the first integrated circuit (IC) package. The gap controller may be provided and coupled to the first die (e.g., on or about a center of the back side surface of the first die 211). Examples of a gap controller include the gap controller 270, the gap controller 370, the gap controller 470, and the gap controller 570.

The method forms (at 1515) a second integrated circuit (IC) package that includes a second die. Examples of forming a second integrated circuit (IC) package are illustrated and described in FIGS. 11A-11C and 13A-13B. In some implementations, the second integrated circuit (IC) package may include a fan out wafer level package (FOWLP). The second integrated circuit (IC) package may include a package substrate or a redistribution portion. The second integrated circuit (IC) package may include an encapsulation layer. Examples of a second package (e.g., second integrated circuit (IC) package) include the second package 202 and the second package 902.

The method couples (at 1520) the second integrated circuit (IC) package to the first integrated circuit (IC) package through a plurality of package interconnects (e.g., plurality of package interconnects 227).

The method optionally forms (at 1525) a first encapsulation layer between the first integrated circuit (IC) package and the second integrated circuit (IC) package. In particular, the first encapsulation layer (e.g., first encapsulation layer 216) is formed between the first die of a first package and the second package (e.g., second package substrate of the second package, second redistribution portion of the second package).

Exemplary Electronic Devices

Figure 16:
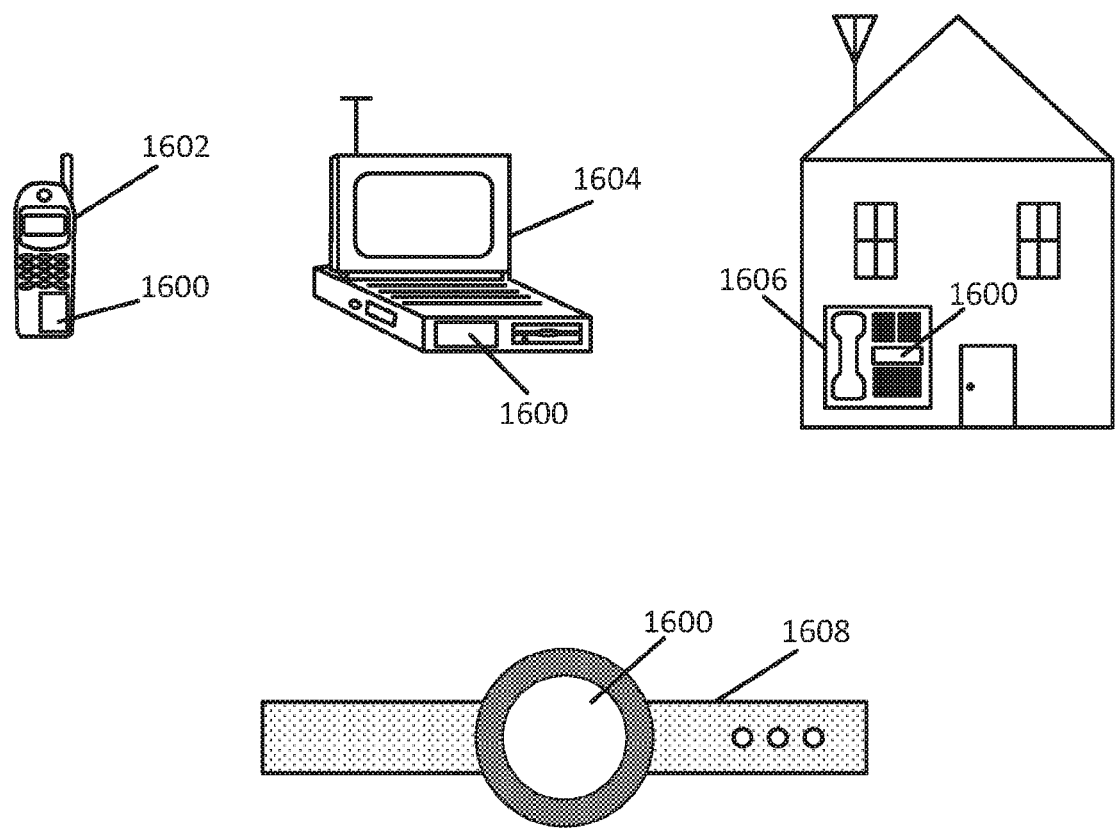
FIG. 16 illustrates various electronic devices that may include the various integrated devices, integrated device packages, semiconductor devices, dies, integrated circuits, and/or packages described herein.

FIG. 16 illustrates various electronic devices that may be integrated with any of the aforementioned integrated device, semiconductor device, integrated circuit, die, interposer, package or package-on-package (PoP). For example, a mobile phone device 1602, a laptop computer device 1604, a fixed location terminal device 1606, a wearable device 1608 may include an integrated device 1600 as described herein. The integrated device 1600 may be, for example, any of the integrated circuits, dies, integrated devices, integrated device packages, integrated circuit devices, device packages, integrated circuit (IC) packages, package-on-package devices described herein. The devices 1602, 1604, 1606, 1608 illustrated in FIG. 16 are merely exemplary. Other electronic devices may also feature the integrated device 1600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10, 11A-11C, 12, 13A-13B, 14, 15 and/or 16 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8, 9, 10, 11A-11C, 12, 13A-13B, 14, 15 and/or 16 and its corresponding description in the present disclosure is not limited to dies and/or ICs. In some implementations, FIGS. 2, 3, 4, 5, 6, 7, 8, 9, 10, 11A-11C, 12, 13A-13B, 14, 15 and/or 16 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package on package (PoP) device comprising:
   a first package comprising a first electronic package component, the first package comprising a first active front side and a first back side;
   a second package comprising a second active front side and a second back side, the second package coupled to the first package such that the second back side of the second package faces the first active front side of the first package, wherein the second package is electrically coupled to the first package through a plurality of solder interconnects;
   at least one gap controller located between the first electronic package component and the second package, wherein the at least one gap controller is coupled to the first package but free of bonding with the second package, wherein the at least one gap controller is configured to provide a minimum gap between the first electronic package component and the second package, the at least one gap controller comprising:
      a spacer; and
      an adhesive layer that couples the spacer to the first package; and
   a first encapsulation layer formed at least between the first electronic package component and the second package such that at least some of the first encapsulation layer physically touches the first electronic package component, wherein at least some of the first encapsulation layer formed between the first electronic package component and the second package is located laterally to the at least one gap controller.

2. The package on package (PoP) of claim 1, wherein the first electronic package component includes a first die.

3. The package on package (PoP) of claim 1, wherein the at least one gap controller is located on or about a center of the first package.

4. The package on package (PoP) of claim 1, wherein the at least one gap controller is located on or about a center of the first electronic package component.

5. The package on package (PoP) device of claim 1, wherein the second package includes a second package substrate, and the at least one gap controller is located between the first electronic package component and the second package substrate.

6. The package on package (PoP) device of claim 5, wherein the first encapsulation layer is formed between the first electronic package component and the second package substrate.

7. The package on package (PoP) device of claim 1, wherein the second package includes a second redistribution portion, and the at least one gap controller is located between the first electronic package component and the second redistribution portion.

8. The package on package (PoP) device of claim 7, wherein the first encapsulation layer is formed between the first electronic package component and the second redistribution portion.

9. The package on package (PoP) device of claim 1, wherein the first encapsulation layer fills at least a majority of a vertical space between the first electronic package component and the second package.

10. The package on package (PoP) device of claim 1, wherein the first encapsulation layer at least partially encapsulates the at least one gap controller.

11. The package on package (PoP) device of claim 1, wherein the at least one gap controller has a thickness that is less than a gap between the first electronic package component and the second package.

12. The package on package (PoP) device of claim 1, wherein the package on package (PoP) device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

13. The package on package (PoP) device of claim 1, wherein the at least one gap controller is configured to provide a minimum gap in a range of about 15-100 microns (μm).

14. The package on package (PoP) device of claim 1, wherein the adhesive layer comprises an underfill, a corner fill material, an RTV silicon, and/or a sintering paste.

15. An apparatus comprising:
   a first package comprising a first electronic package component, the first package comprising a first active front side and a first back side;
   a second package comprising a second active front side and a second back side, the second package coupled to the first package such that the second back side of the second package faces the first active front side of the first package, wherein the second package is electrically coupled to the first package through a plurality of solder interconnects;

means for gap control configured to provide a minimum gap between the first electronic package component and the second package, wherein the means for gap control is coupled to the first package but free of bonding with the second package, the means for gap control located between the first package and the second package, the means for gap control comprising:

a spacer; and an adhesive layer that couples the spacer to the first package; and a first encapsulation layer formed at least between the first electronic package component and the second package such that at least some of the first encapsulation layer physically touches the first electronic package component, wherein at least some of the first encapsulation layer formed between the first package and the second package (i) is located laterally to the means for gap control, and (ii) at least partially encapsulates the plurality of solder interconnects.

16. The apparatus of claim 15, wherein the first electronic package component includes a first die.

17. The apparatus of claim 15, wherein the means for gap control is located on or about a center of the first package.

18. The apparatus of claim 15, wherein the means for gap control is located on or about a center of the first electronic package component.

19. The apparatus of claim 15, wherein the second package includes a second package substrate, and the means for gap control is located between the first electronic package component and the second package substrate.

20. The apparatus of claim 19, wherein the first encapsulation layer is formed between the first electronic package component and the second package substrate.

21. The apparatus of claim 15, wherein the second package includes a second redistribution portion, and the means for gap control is located between the first electronic package component and the second redistribution portion.

22. The apparatus of claim 21, wherein the first encapsulation layer is formed between the first electronic package component and the second redistribution portion.

23. The apparatus of claim 15, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

24. A package on package (PoP) device comprising:

a first package comprising a first electronic package component, the first package comprising a first active front side and a first back side;

a second package comprising a substrate, the second package comprising a second active front side and a second back side, the second package coupled to the first package such that the second back side of the second package faces the first active front side of the first package, wherein the second package is electrically coupled to the first package through a plurality of solder interconnects;

at least one gap controller located between the first electronic package component and the substrate of the second package, wherein the at least one gap controller is coupled to the first package but free of direct bonding with the substrate of the second package, wherein the at least one gap controller is configured to provide a minimum gap between the first electronic package component and the substrate of the second package, the at least one gap controller comprising:

a spacer; and an adhesive layer that couples the spacer to the first package; and a first encapsulation layer formed at least between the first package and the second package such that at least some of the first encapsulation layer physically touches the first electronic package component, wherein at least some of the first encapsulation layer formed between the first package and the second package (i) is located laterally to the at least one gap controller, and (ii) at least partially and laterally encapsulates the plurality of solder interconnects and the at least one gap controller.

* * * * *